(12) United States Patent
Takamura et al.

(10) Patent No.: US 12,696,508 B2
(45) Date of Patent: Jul. 28, 2026

(54) SiC SEMICONDUCTOR SUBSTRATE AND FABRICATION METHOD OF THE SiC SEMICONDUCTOR SUBSTRATE

(71) Applicant: ROHM CO., LTD., Kyoto (JP)

(72) Inventors: Makoto Takamura, Kyoto (JP); Takuji Maekawa, Kyoto (JP); Mitsuru Morimoto, Kyoto (JP); Noriyuki Masago, Kyoto (JP); Takayasu Oka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 128 days.

(21) Appl. No.: 18/357,175

(22) Filed: Jul. 24, 2023

(65) Prior Publication Data

US 2023/0369412 A1 Nov. 16, 2023

Related U.S. Application Data

(63) Continuation of application No. PCT/JP2021/040067, filed on Oct. 29, 2021.

(30) Foreign Application Priority Data

Jan. 25, 2021 (JP) ................................. 2021-009856

(51) Int. Cl.
*H10D 62/832* (2025.01)
*C30B 29/36* (2006.01)
(Continued)

(52) U.S. Cl.
CPC ......... *H10D 62/8325* (2025.01); *C30B 29/36* (2013.01); *H10D 62/40* (2025.01);
(Continued)

(58) Field of Classification Search
CPC ............... C30B 29/36; H01L 21/02444; H01L 21/02447; H01L 21/02499;
(Continued)

(56) References Cited

U.S. PATENT DOCUMENTS 8,916,451 B2 12/2014 Bayram et al.
2009/0186470 A1 * 7/2009 Takahashi ............... H10D 30/66
257/E21.054
(Continued)

FOREIGN PATENT DOCUMENTS

JP WO-2012/099209 A1 * 6/2014 ........... H01L 21/205
JP 6206786 B2 10/2017
(Continued)

OTHER PUBLICATIONS

Zhao, Zhifei, et al., "Growth of high-quality 4H-SiC epitaxial layers on 4-degree off-axis C-face 4H-SiC substrates", Journal of Crystal Growth vol. 531, pp. 125355-1-125355-3 (Year: 2020).*
(Continued)

*Primary Examiner* — Fernando L Toledo
*Assistant Examiner* — Ryan T. Fortin
(74) *Attorney, Agent, or Firm* — XSENSUS LLP

(57) ABSTRACT

A semiconductor substrate disclosed herein includes: an SiC single crystal substrate; a graphene layer disposed on an Si plane of the SiC single crystal substrate; an SiC epitaxial growth layer disposed above the SiC single crystal substrate via the graphene layer; and a polycrystalline Si layer disposed on an Si plane of the SiC epitaxial growth layer. The semiconductor substrate may include a graphite substrate or an silicon substrate disposed on a polycrystalline Si layer. The semiconductor substrate may include an SiC polycrystalline growth layer disposed on a C plane of the SiC epitaxial growth layer.

13 Claims, 22 Drawing Sheets

(51) Int. Cl.

| | |
|---|---|
| *H10D 8/60* | (2025.01) |
| *H10D 62/40* | (2025.01) |
| *H10D 62/80* | (2025.01) |
| *H10P 14/20* | (2026.01) |

(52) U.S. Cl.

CPC ....... *H10D 62/882* (2025.01); *H10P 14/3206* (2026.01); *H10P 14/3208* (2026.01); *H10P 14/3246* (2026.01); *H10P 14/3408* (2026.01); *H10P 14/3456* (2026.01); *H10P 14/3822* (2026.01); *H10D 8/60* (2025.01)

(58) Field of Classification Search

CPC ......... H01L 21/02529; H01L 21/02595; H01L 21/02694; H10D 8/60; H10D 62/8325; H10D 62/40; H10D 62/882

See application file for complete search history.

(56) References Cited

U.S. PATENT DOCUMENTS

| | | | |
|---|---|---|---|
| 2013/0099253 A1* | 4/2013 | Ohtsuka ............. | H10D 62/8325 257/77 |
| 2014/0220764 A1 | 8/2014 | Bayram et al. | |
| 2015/0214040 A1 | 7/2015 | Celler | |
| 2017/0213735 A1 | 7/2017 | Imaoka et al. | |
| 2018/0197736 A1 | 7/2018 | Kim | |
| 2020/0058737 A1* | 2/2020 | Wu ...................... | H10D 62/115 |

FOREIGN PATENT DOCUMENTS

| | | | |
|---|---|---|---|
| JP | 6544166 | B2 | 7/2019 |
| JP | 6582779 | B2 | 10/2019 |
| JP | 2019-210161 | A | 12/2019 |
| WO | 2016140229 | A1 | 9/2016 |
| WO | 2017/044577 | A1 | 3/2017 |

OTHER PUBLICATIONS

Rau, B., et al., "Low-temperature Si epitaxy on large-grained polycrystalline seed layers by electron-cyclotron resonance chemical vapor deposition", Journal of Crystal Growth 270, pp. 396-401 (Year: 2004).*

International Search Report and Written Opinion mailed on Jan. 11, 2022, received for PCT Application PCT/JP2021/040067, filed on Oct. 29, 2021, 14 pages including English Translation.

Notice of Reasons for Refusal dated Jul. 1, 2025, in corresponding Japanese patent application No. JP2022-576987 (6) pages; with English machine translation).

Notice of Reasons for Refusal dated Nov. 18, 2025, in corresponding Japanese patent application No. JP2022-576987 (6 pages; with English machine translation).

Decision of Refusal dated Apr. 14, 2026, in corresponding Japanese patent application No. JP2022-576987 (4 pages; with English machine translation).

Decision of Dismissal of Amendment dated Apr. 14, 2026, in corresponding Japanese patent application No. JP2022-576987 (6 pages; with English machine translation).

* cited by examiner

FIG. 24A
n
(0001)PLANE
Si PLANE
OFF
ANGLE
θ
[11$\bar{2}$0]
[000$\bar{1}$]
[0001]
a₃
a₁
(000$\bar{1}$)PLANE
C PLANE
a₂
FIG. 24B
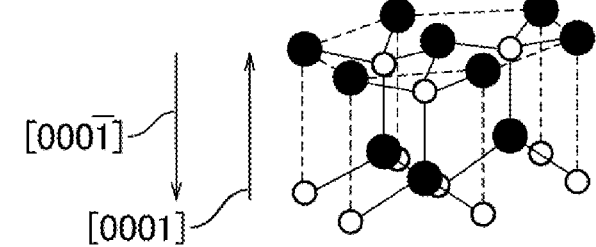
[000$\bar{1}$]
[0001]
FIG. 24C
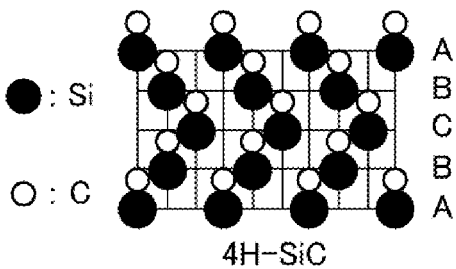
● : Si
○ : C
A
B
C
B
A
4H-SiC

SiC SEMICONDUCTOR SUBSTRATE AND FABRICATION METHOD OF THE SiC SEMICONDUCTOR SUBSTRATE

CROSS REFERENCE TO RELATED APPLICATIONS

This is a continuation application (CA) of PCT Application No. PCT/JP2021/040067, filed on Oct. 29, 2021, which claims priority to Japan Patent Application No. 2021-009856, filed on Jan. 25, 2021, the entire contents of each of which are incorporated herein by reference.

FIELD

The embodiments described herein relate to a semiconductor substrate and a fabrication method of such a semiconductor substrate.

BACKGROUND

In recent years, since Silicon Carbide (SiC) semiconductors have wider bandgap energy and has high breakdown voltage performance at high electric field than silicon semiconductors or GaAs semiconductors, much attention has been given to such SiC semiconductors capable of realizing high breakdown voltage, high current use, low on resistance, high degree of efficiency, power consumption reduction, high speed switching, and the like.

As a method of forming an SiC wafer, for example, there are a method of forming an SiC epitaxial growth layer by a Chemical Vapor Deposition (CVD) method on an SiC single crystal substrate by a sublimation method; a method of bonding an SiC single crystal substrate by the sublimation method to an SiC CVD polycrystalline substrate and also form an SiC epitaxial growth layer on the SiC single crystal substrate by the CVD method; and the like.

Conventionally, there have been provided devices made of SiC, such as Schottky Barrier Diodes (SBDs), Metal Oxide Semiconductor Field Effect Transistors (MOSFETs), and Insulated Gate Bipolar Transistors (IGBTs), for power control applications.

BRIEF DESCRIPTION OF DRAWINGS

FIG. 24A illustrates a bird's-eye view of a unit cell of a 4H—SiC crystal applicable to the SiC epitaxial growth layer of the semiconductor substrate according to the embodiments.

FIG. 24B illustrates a configuration diagram of a two-layer portion of the 4H—SiC crystal.

FIG. 24C illustrates a configuration diagram of a four-layer portion of the 4H—SiC crystal.

DESCRIPTION OF EMBODIMENTS

Figure 1A:
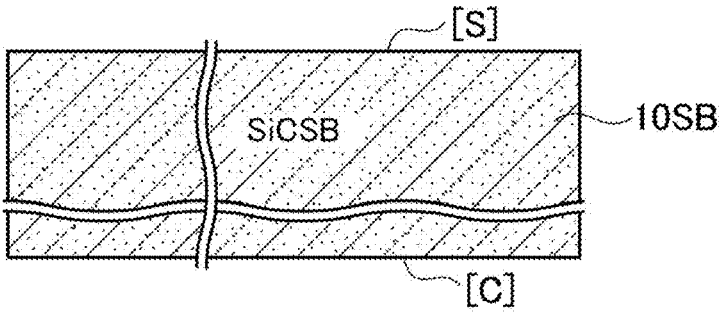
FIG. 1A illustrates a fabrication method of a semiconductor substrate according to the first embodiment, which illustrates a cross-sectional diagram of an SiC single crystal substrate.

Next, certain embodiments will now be explained with reference to drawings. In the description of the following drawings to be explained, the identical or similar reference sign is attached to the identical or similar part. However, the drawings are merely schematic.

Moreover, the embodiments described hereinafter merely exemplify the device and method for materializing the technical idea; and the embodiments do not specify the material, shape, structure, placement, etc. of each part as the following. The embodiments disclosed herein may be differently modified.

In the following description of the embodiments, [C] means a C plane of SiC and [S] means an Si plane of SiC.

SiC semiconductor substrates on which such SiC based devices as conventional are formed have been sometimes fabricated by bonding a single-crystal SiC semiconductor substrate onto a polycrystal SiC semiconductor substrate in order to reduce fabricating costs or to provide desired physical properties.

In the technology of bonding the single-crystal SiC semiconductor substrate to the polycrystal SiC semiconductor substrate, it has been necessary to bond the high-quality single-crystal SiC semiconductor substrate to the polycrystal SiC semiconductor substrate without defects in order to grow up an epitaxial layer on the single-crystal SiC semiconductor substrate bonded to the polycrystal SiC semiconductor substrate. However, a polishing process for ensuring surface roughness required in order to bond the single-crystal SiC semiconductor substrate to the polycrystal SiC semiconductor substrate by room temperature bonding or diffusion bonding becomes costly, and a yield may be decreased due to film defects generated at the bonding interface therebetween.

The embodiments provide a low-cost and high-quality semiconductor substrate and a fabrication method of such a semiconductor substrate.

According to one aspect of the embodiments, there is provided a semiconductor substrate comprising: an SiC single crystal substrate; a graphene layer disposed on an Si plane of the SiC single crystal substrate; an SiC epitaxial growth layer disposed above the SiC single crystal substrate via the graphene layer; and a polycrystalline layer disposed on an Si plane of the SiC epitaxial growth layer.

According to another aspect of the embodiments, there is provided a fabrication method for a semiconductor substrate, the fabrication method comprising: forming a graphene layer on an Si plane of an SiC single crystal substrate; forming an SiC epitaxial growth layer on the graphene layer; forming a first layer on the SiC epitaxial growth layer; applying annealing treatment to the first layer so as to be polycrystallized and forming a second layer on the SiC epitaxial growth layer; bonding a provisional substrate onto the second layer; removing the SiC single crystal substrate from the graphene layer; forming an SiC polycrystalline growth layer on a C plane of the SiC epitaxial growth layer; exposing the provisional substrate, and applying annealing treatment to the provisional substrate so as to be sublimated; and eliminating the SiC polycrystalline growth layer.

First Embodiment (Semiconductor Substrate)

Figure 2:
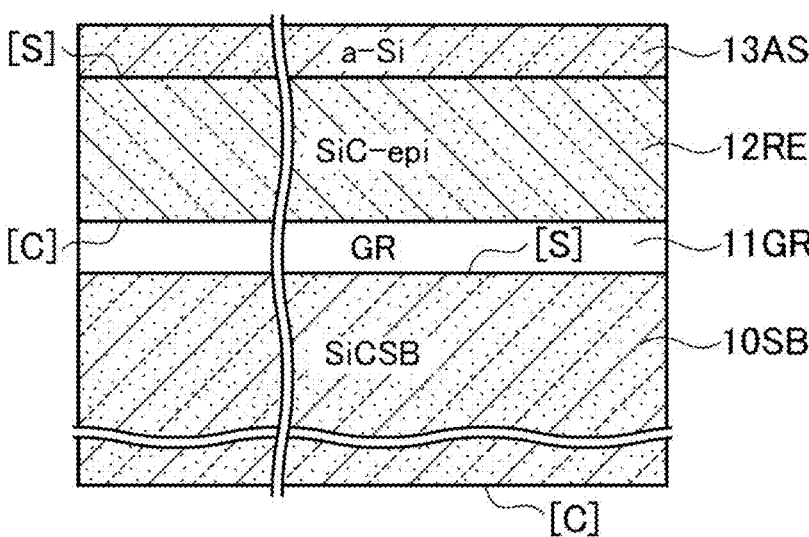
FIG. 2 illustrates the fabrication method of the semiconductor substrate according to the first embodiment, which illustrates a cross-sectional diagram of a structure in which an amorphous Si layer is formed on the SiC epitaxial growth layer.

As illustrated in FIG. 2, a semiconductor substrate according to the first embodiment includes: an SiC single crystal substrate (SiCSB) 10SB; a graphene layer (GR)11GR disposed on an Si plane of the SiC single crystal substrate 10SB; an SiC epitaxial growth layer (SiC-epi) 12RE disposed above the SiC single crystal substrate 10SB via a graphene layer 11GR; and an amorphous layer disposed on the Si plane of the SiC epitaxial growth layer 12RE.

In this case, the amorphous layer includes an amorphous Si layer (a-Si) 13AS. Alternatively, it may include a microcrystalline layer 13MC of Si (refer to FIG. 4B), instead of the amorphous Si layer 13AS. The microcrystalline layer 13MC of Si can be obtained by, for example, applying low-temperature annealing treatment (approximately 550° C. to approximately 700° C.) to the amorphous Si layer 13AS.

Figure 3:
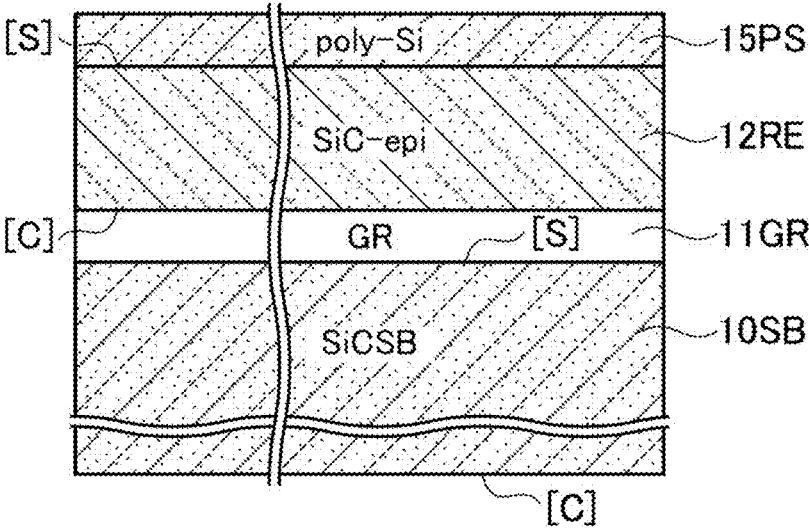
FIG. 3 illustrates the fabrication method of the semiconductor substrate according to the first embodiment, which illustrates a cross-sectional diagram of a structure in which an amorphous Si layer is polycrystallized by annealing treatment and the polycrystalline Si layer is formed on the SiC epitaxial growth layer.

Alternatively, as illustrated in FIG. 3, the semiconductor substrate according to the first embodiment may include: an SiC single crystal substrate 10SB; a graphene layer 11GR disposed on an Si plane of the SiC single crystal substrate 10SB; an SiC epitaxial growth layer 12RE disposed above the SiC single crystal substrate 10SB via a graphene layer 11GR; and a polycrystalline layer disposed on an Si plane of the SiC epitaxial growth layer 12RE.

In this case, the polycrystalline layer includes a polycrystalline Si layer (poly-Si) 15PS. The polycrystalline Si layer (poly-Si) 15PS by, for example, applying medium-temperature annealing treatment (approximately 700° C. to approximately 900° C.) or applying high-temperature annealing treatment (approximately 900° C. to approximately 1100° C.) to the amorphous Si layer 13AS.

Figure 6A:
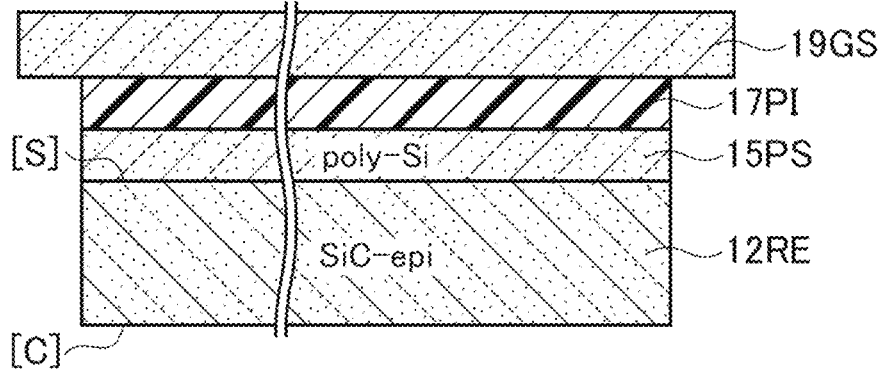
FIG. 6A illustrates the fabrication method of the semiconductor substrate according to the first embodiment, which illustrates a cross-sectional diagram of the SiC epitaxial growth layer side of a structure in which a graphite substrate is bonded via a bonding layer on the polycrystalline Si layer and the SiC single crystal substrate is removed at an interface between the SiC epitaxial growth layer and the graphene layer.

Alternatively, as illustrated in FIG. 6A, the semiconductor substrate according to the first embodiment may include: an SiC epitaxial growth layer 12RE; a polycrystalline Si layer 15PS disposed on the SiC epitaxial growth layer 12RE; and a graphite substrate 19GS disposed on the polycrystalline Si layer 15PS. In this case, the graphite substrate 19GS is connected onto the polycrystalline Si layer 15PS via the bonding layer 17PI.

Figure 7:
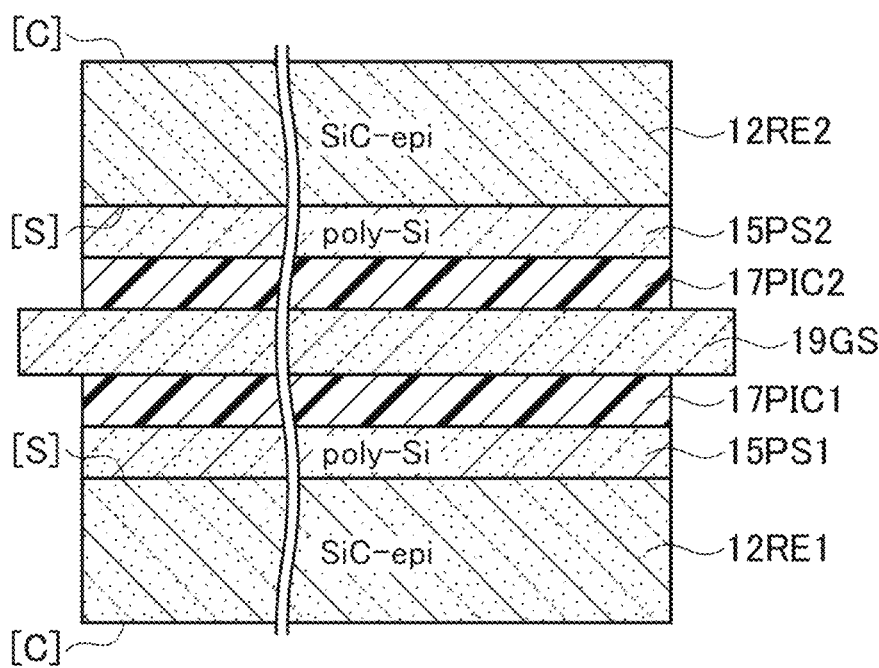
FIG. 7 illustrates the fabrication method of the semiconductor substrate according to the first embodiment, which illustrates a cross-sectional diagram of a structure in which the removed structure illustrated in FIG. 6A is bonded on both surfaces of the graphite substrate and a bonding layer carbonized by annealing treatment is formed.

Alternatively, as illustrated in FIG. 7, the semiconductor substrate according to the first embodiment may includes a configuration in which the semiconductor substrate illustrated in FIG. 6A is disposed on both surfaces of the graphite substrate 19GS.

Figure 8:
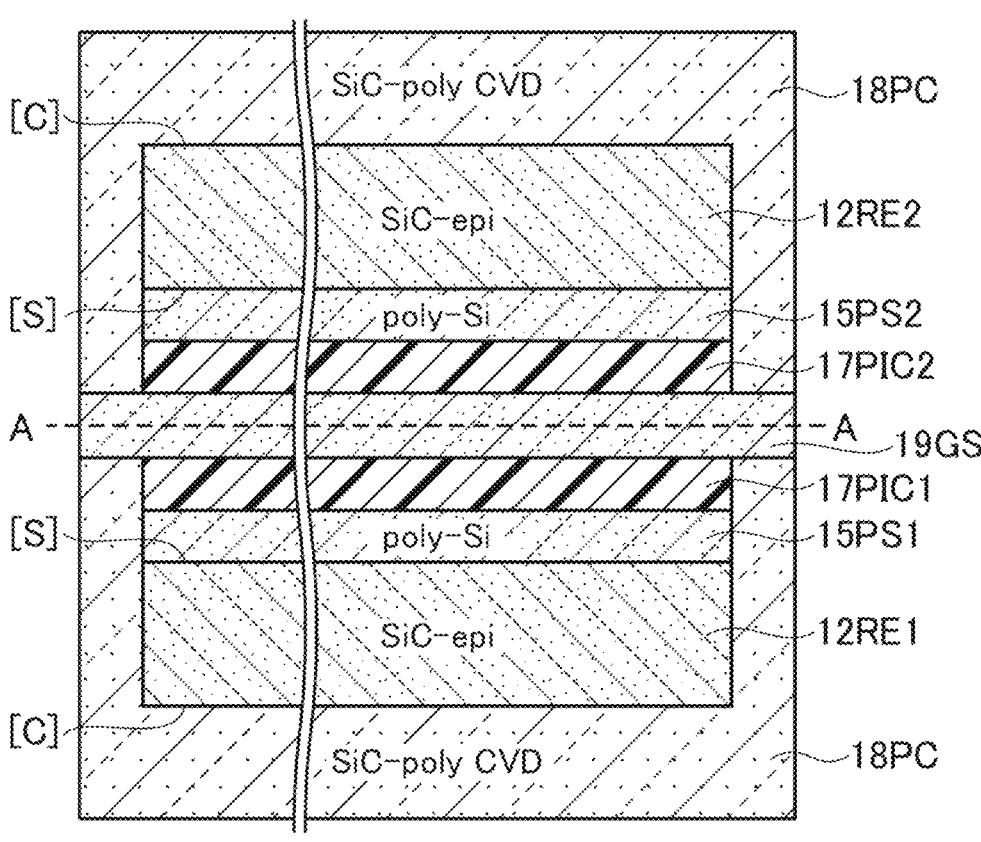
FIG. 8 illustrates the fabrication method of the semiconductor substrate according to the first embodiment, which illustrates a cross-sectional diagram of a structure in which an SiC polycrystalline growth layer is formed by a CVD method and an outer periphery thereof is ground.
Figure 9:
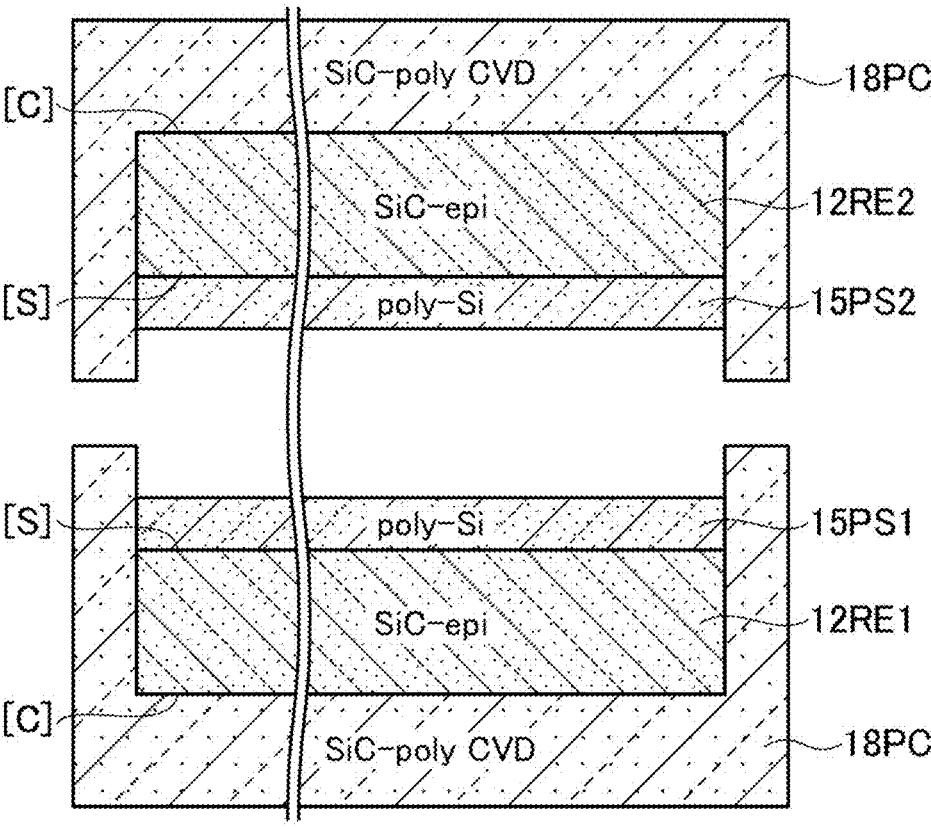
FIG. 9 illustrates the fabrication method of the semiconductor substrate according to the first embodiment, which illustrates a cross-sectional diagram of a structure in which the graphite substrate and the carbonized bonding layer are sublimated by annealing treatment.
Figure 10:
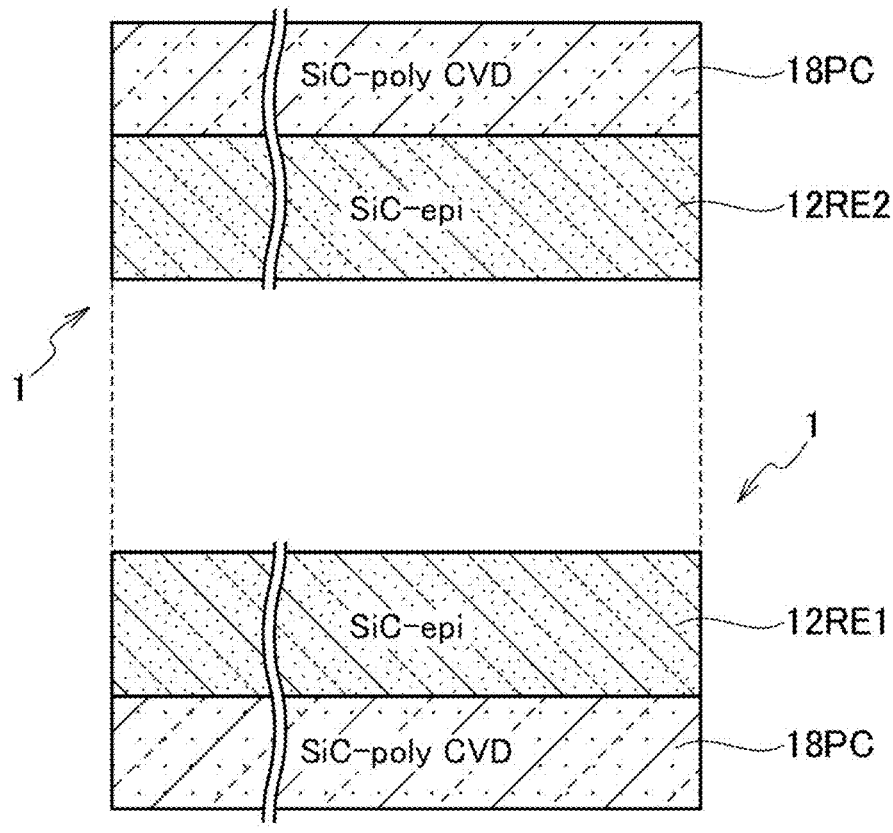
FIG. 10 illustrates the fabrication method of the semiconductor substrate according to the first embodiment, which illustrates a cross-sectional diagram of a structure in which the SiC polycrystalline growth layer and the poly Si layer are eliminated and the SiC epitaxial growth layer is provided on the SiC polycrystalline growth layer.

Alternatively, as illustrated in FIGS. 8 to 10, the semiconductor substrate according to the first embodiment may includes an SiC polycrystalline growth layer 18PC disposed on C planes of the SiC epitaxial growth layers 12RE1 and 12RE2. In this case, the SiC epitaxial growth layers 12RE1 and 12RE2 are transferred to the SiC polycrystalline growth layer 18PC.

Figure 11:
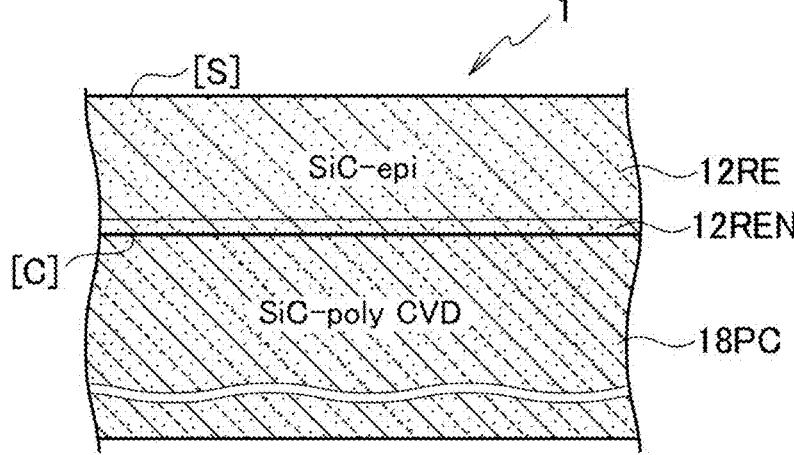
FIG. 11 illustrates the fabrication method of the semiconductor substrate according to the first embodiment, which illustrates a cross-sectional diagram of a structure in which a highly doped layer is provided at an interface between the SiC polycrystalline growth layer and the SiC epitaxial growth layer.

Alternatively, as illustrated in FIG. 11, the semiconductor substrate according to the first embodiment 1 may includes a highly doped layer 12REN having higher impurity concentration than that of the SiC epitaxial growth layer 12RE at an interface between the SiC polycrystalline growth layer 18PC and the SiC epitaxial growth layer 12RE.

Alternatively, the graphene layer 11GR may includes a single-layer structure or multi-layer laminated structure of graphene.

The SiC epitaxial growth layer 12RE is formed above the SiC single crystal substrate 10SB via the graphene layer 11GR by remote epitaxial growth. The SiC single crystal substrate 10SB can be reused by being removed from the SiC epitaxial growth layer 12RE.

(Fabrication Method)

Figure 1B:
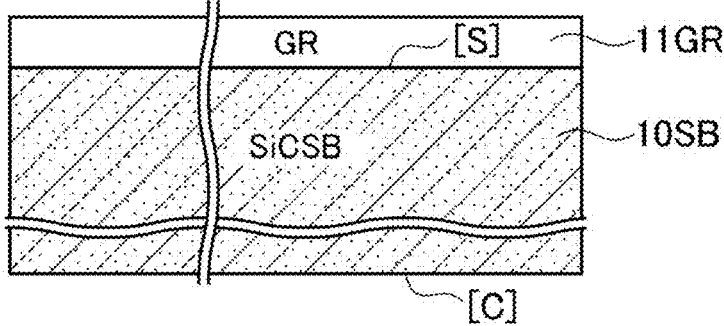
FIG. 1B illustrates the fabrication method of the semiconductor substrate according to the first embodiment, which illustrates a cross-sectional diagram of a structure in which a graphene layer is formed on the SiC single crystal substrate.
Figure 1C:
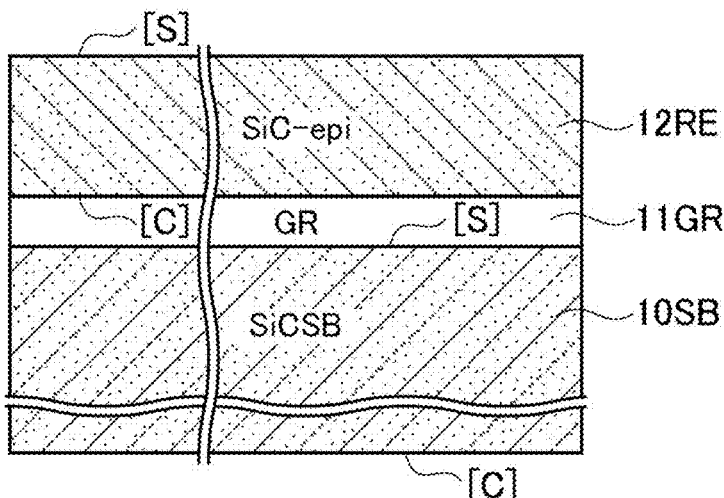
FIG. 1C illustrates the fabrication method of the semiconductor substrate according to the first embodiment, which illustrates a cross-sectional diagram of a structure in which an SiC epitaxial growth layer is formed on the graphene layer.

In a fabrication method of the semiconductor substrate according to the first embodiment, FIG. 1A illustrates a cross-sectional diagram of the SiC single crystal substrate 10SB, FIG. 1B illustrates a cross-sectional diagram of a structure in which the graphene layer 11GR is formed on the SiC single crystal substrate 10SB, and FIG. 1C illustrates a cross-sectional diagram of a structure in which the SiC epitaxial growth layer 12RE is formed on the graphene layer 11GR.

In the fabrication method of the semiconductor substrate according to the first embodiment, FIG. 2 illustrates a cross-sectional diagram of a structure in which the amorphous Si layer 13AS is formed on the SiC epitaxial growth layer 12RE.

FIG. 3 illustrates the fabrication method of the semiconductor substrate according to the first embodiment, which illustrates a cross-sectional diagram of a structure in which an amorphous Si layer 13AS is polycrystallized by annealing treatment and the polycrystalline Si layer 15PS is formed on the SiC epitaxial growth layer 12RE.

Figure 6B:
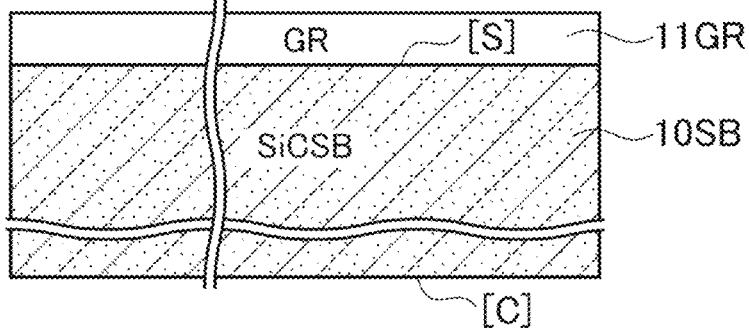
FIG. 6B illustrates the fabrication method of the semiconductor substrate according to the first embodiment, which illustrates a cross-sectional diagram of the graphene layer side of a structure in which a graphite substrate is bonded via a bonding layer on the polycrystalline Si layer and the SiC single crystal substrate is removed at an interface between the SiC epitaxial growth layer and the graphene layer.

FIG. 6A illustrates the fabrication method of the semiconductor substrate according to the first embodiment, which illustrates a cross-sectional diagram of the SiC epitaxial growth layer 12RE side of a structure in which a graphite substrate 19GS is bonded via a bonding layer 17PI on the polycrystalline Si layer 15PS and the SiC single crystal substrate is removed at an interface between the SiC epitaxial growth layer 12RE and the graphene layer 11GR. A cross-sectional diagram at the graphene layer 11GR side is illustrated as illustrated in FIG. 6B.

FIG. 7 illustrates the fabrication method of the semiconductor substrate according to the first embodiment, which illustrates a cross-sectional diagram of a structure in which the removed structure illustrated in FIG. 6A is bonded on both surfaces of the graphite substrate 19GS and bonding layers 17PIC1 and 17PIC2 carbonized by annealing treatment are formed.

FIG. 8 illustrates the fabrication method of the semiconductor substrate according to the first embodiment, which illustrates a cross-sectional diagram of a structure in which an SiC polycrystalline growth layer 18PC is formed by a CVD method and an outer periphery thereof is ground.

FIG. 9 illustrates the fabrication method of the semiconductor substrate according to the first embodiment, which illustrates a cross-sectional diagram of a structure in which the graphite substrate 19GS and the carbonized bonding layers 17PIC1 and 17PIC2 are sublimated by annealing treatment.

FIG. 10 illustrates the fabrication method of the semiconductor substrate according to the first embodiment, which illustrates a cross-sectional diagram of a structure in which the SiC polycrystalline growth layer 18PC and the poly Si layers 15PS1 and 15PS2 are eliminated and the SiC epitaxial growth layers 12RE1 and 12RE2 are respectively provided on the SiC polycrystalline growth layers 18PC.

FIG. 11 illustrates the fabrication method of the semiconductor substrate according to the first embodiment, which illustrates a cross-sectional diagram of a structure of including a highly doped layer 12REN having higher impurity concentration than that of the SiC epitaxial growth layer 12RE at an interface between the SiC polycrystalline growth layer 18PC and the SiC epitaxial growth layer 12RE.

(Mechanism for Generating Tensile Stress)

A mechanism for generating a tensile stress will now be described with reference to FIGS. 4A to 4C.

Figure 4A:
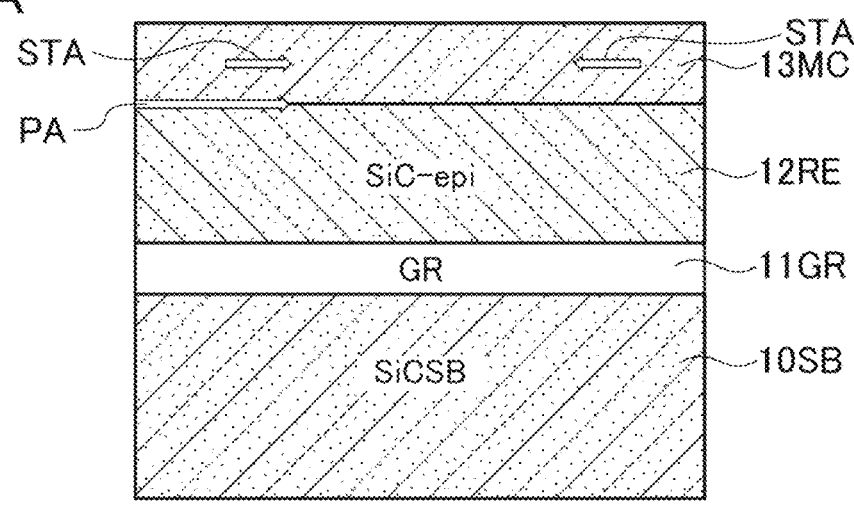
FIG. 4A is an explanatory diagram of a mechanism for generating a tensile stress, which illustrates an explanatory diagram of an interlayer removing mode in a cross-sectional structure in which the amorphous Si layer is microcrystallized by low-temperature annealing treatment and the microcrystalline layer is formed, in the structure (FIG. 2) in which the amorphous Si layer is formed on the SiC epitaxial layer.

First, in the structure illustrated in FIG. 2, FIG. 4A illustrates a cross-sectional structure in which an amorphous Si layer 13AS is microcrystallized by low-temperature annealing treatment and the microcrystalline layer 13MC of Si is formed. The microcrystalline layer 13MC of Si can be obtained by, for example, applying low-temperature annealing treatment (approximately 550° C. to approximately 700° C.) to the amorphous Si layer 13AS.

In the low-temperature annealing treatment, as illustrated in FIG. 4A, a tensile stress STA is mainly generated at an interface between the microcrystalline layer 13MC of Si and the SiC epitaxial growth layer 12RE. This results in an interlayer removing mode where removal occurs at the interface between the microcrystalline layer 13MC of Si and the SiC epitaxial growth layer 12RE, as indicated by the arrow PA.

Figure 4B:
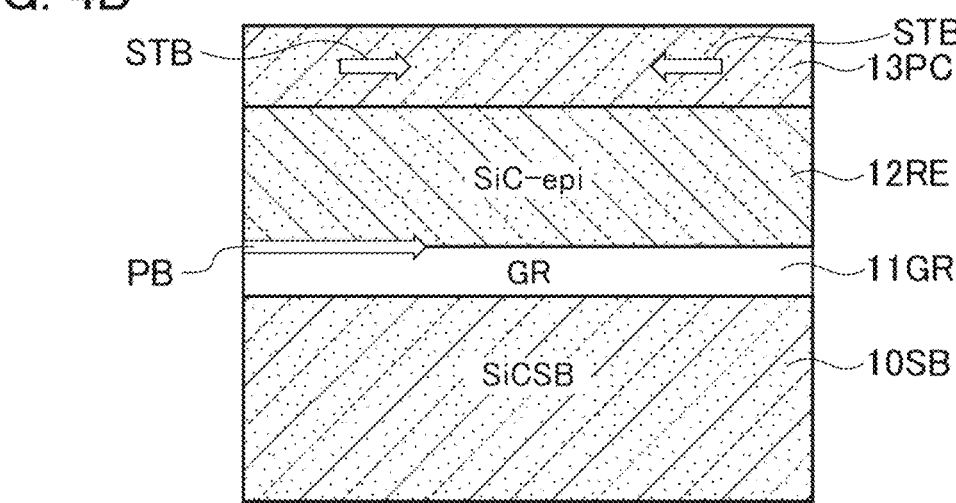
FIG. 4B is an explanatory diagram of the mechanism for generating the tensile stress, which illustrates an explanatory diagram of a removing mode in a cross-sectional structure in which the microcrystalline film is polycrystallized by medium-temperature annealing treatment and the polycrystalline film is formed.

Next, FIG. 4B illustrates a cross-sectional structure in which the microcrystalline layer 13MC of Si is polycrystallized by medium-temperature annealing treatment and the polycrystalline layer 13PC of Si is formed. The polycrystalline layer 13PC of Si can be obtained by, for example, applying medium-temperature annealing treatment (approximately 700° C. to approximately 900° C.) to the microcrystalline layer 13MC of Si. In the medium-temperature annealing treatment, as illustrated in FIG. 4B, a tensile stress STB is mainly generated at an interface between the SiC epitaxial growth layer 12RE and the graphene layer 11GR. This results in a removing mode where removal occurs at the interface between the SiC epitaxial growth layer 12RE and the graphene layer 11GR, as indicated by the arrow PB.

Figure 4C:
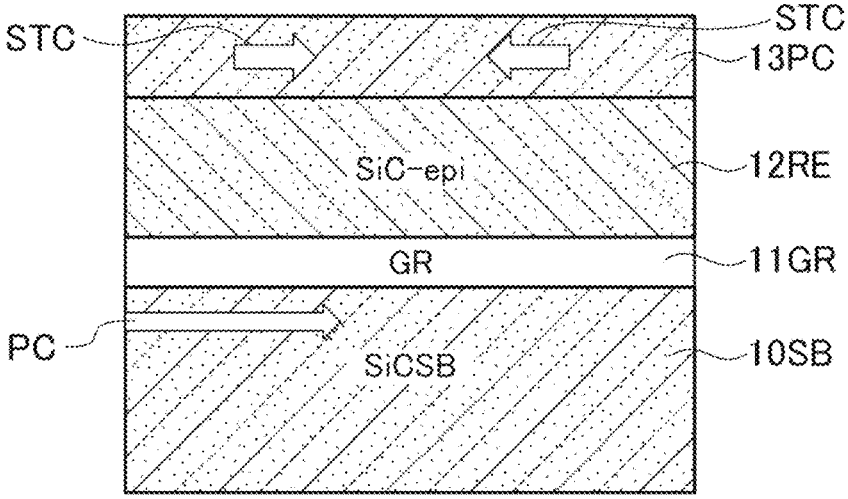
FIG. 4C is an explanatory diagram of the mechanism for generates the tensile stress, which illustrates an explanatory diagram of a crush mode in a cross-sectional structure in which the microcrystalline film is polycrystallized by high-temperature annealing treatment and the polycrystalline film is formed.

Next, FIG. 4C illustrates a cross-sectional structure in which the microcrystalline layer 13MC of Si is polycrystallized by high-temperature annealing treatment and the polycrystalline layer 13PC of Si is formed. The polycrystalline layer 13PC of Si can be obtained by, for example, applying high-temperature annealing treatment (approximately 900° C. to approximately 1100° C.) to the microcrystalline layer 13MC of Si. In the high-temperature annealing treatment, as illustrated in FIG. 4C, a tensile stress STC is generated in the SiC single crystal substrate 10SB. This results in a crush mode where the SiC single crystal substrate 10SB is crushed, as indicated by the arrow PC.

Figure 5:
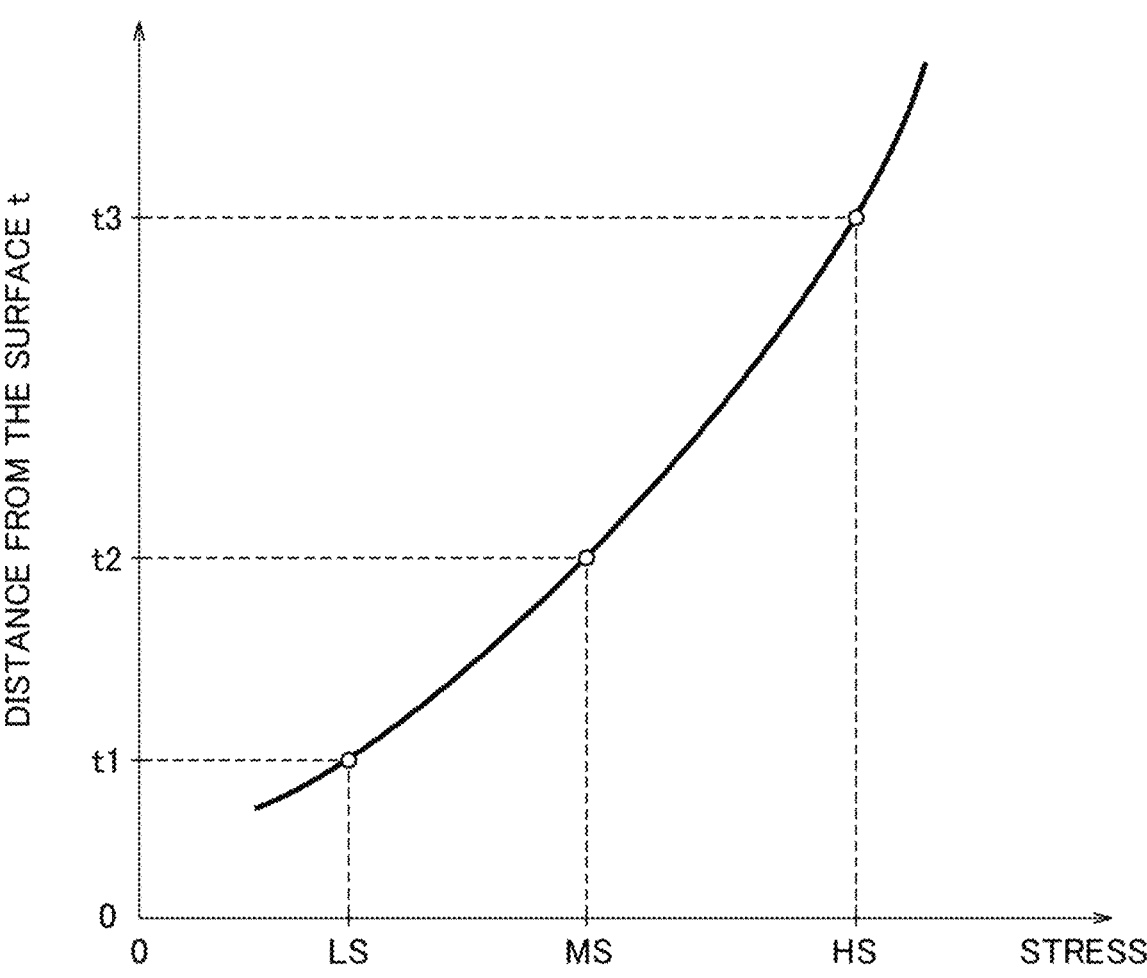
FIG. 5 is an explanatory diagram of the mechanism for generating the tensile stress, which illustrates a relationship of a distance from a surface of a portion to be removed or crushed and a stress.

FIG. 5 is an explanatory diagram of the mechanism for generating the tensile stress, which illustrates a relationship of a distance from a surface of a portion to be removed or crushed and a stress. In FIG. 5, LS, MS, and HS in the horizontal axis respectively denote the amounts of stress STRESS in the low-temperature annealing treatment, the medium-temperature annealing treatment, and the high-temperature annealing treatment. t1, t2, and t3 in the vertical axis respectively represent distances from a device surface of portions to be removed or crushed during the low-temperature annealing treatment, the medium-temperature annealing treatment, and the high-temperature annealing treatment. As illustrated in FIG. 5, as the amount of stress STRESS in the annealing process increases, a tendency is obtained to be shifted to the interlayer removing mode, the removing mode, and the crush mode, and the distance from the surface of portions to be removed or crushed increases.

The fabrication method of the semiconductor substrate according to the first embodiment includes the following processes. More specifically, included are: forming a graphene layer 11GR on an Si plane of an SiC single crystal substrate 10SB; forming an SiC epitaxial growth layer 12RE on the graphene layer 11GR; forming an amorphous Si layer 13AS on the SiC epitaxial growth layer 12RE; applying annealing treatment to the amorphous Si layer 13AS so as to be polycrystallized and forming a polycrystalline Si layer 15PS on the SiC epitaxial growth layer 12RE; bonding a provisional substrate onto the polycrystalline Si layer 15PS; removing the SiC single crystal substrate 10SB from the graphene layer 11GR; forming an SiC polycrystalline growth layer 18PC on a C plane of the SiC epitaxial growth layer 12RE; exposing the provisional substrate, and applying annealing treatment to the provisional substrate so as to be sublimated; and eliminating the polycrystalline Si layer 15PS.

Hereinafter, the fabrication method of the semiconductor substrate according to the first embodiment will be described in detail with reference to drawings.

(A) First, as illustrated in FIGS. 1A and 1B, a graphene layer 11GR up to several molecular layers is formed on a (0001) Si plane of a hexagonal SiC single crystal substrate 10SB serving as a seed substrate.

(B) Next, as illustrated in FIG. 1C, an SiC epitaxial growth layer 12RE is formed by a remote epitaxial growth method on the graphene layer 11GR formed on the SiC single crystal substrate 10SB. The SiC epitaxial growth layer 12RE is a single crystal SiC thin film. In this case, the SiC epitaxial growth layer 12RE is formed on the Si plane of the SiC single crystal substrate 10SB via the graphene layer 11GR by using remote epitaxial growth technology. Through the remote epitaxial growth technology, a plane of the SiC epitaxial growth layer 12RE in contact with the first graphene layer 11GR is the C plane, and a front side surface of the SiC epitaxial growth layer 12RE is the Si plane. Moreover, the graphene layer 11GR may be formed of one layer, or may be formed by laminating several layers, such as two or three layers. The first graphene layer 11GR can be formed, by thermal decomposition, on the Si plane of the SiC single crystal substrate 10SB by annealing the SiC single crystal substrate 10SB at approximately 1700° C., for example, in an atmospheric pressure gaseous argon atmosphere. Alternatively, the graphene layer 11GR may be formed by being laminated by CVD on the SiC single crystal substrate 10SB. The SiC single crystal substrate 10SB is, for example, a 4H—SiC substrate, and the thickness thereof is, for example, approximately 300 μm to about 600 μm.

(C1) Next, as illustrated in FIG. 2, an amorphous Si layer 13AS is formed on the SiC epitaxial growth layer 12RE. The amorphous Si layer 13AS can be formed using sputtering technology or plasma CVD technology. If forming by the sputtering technology, the amorphous Si layer 13AS is not hydrogenated. If forming by the plasma CVD technology, the amorphous Si layer 13AS is hydrogenated to becomes a-Si:H. The amorphous Si layer 13AS is solid-phase recrystallized by, for example, annealing treatment (approximately 600° C. to approximately 1000° C.). If forming by the sputtering technology, it is solid-phase recrystallized by annealing treatment at approximately 1000° C. If forming by the plasma CVD technology, it is solid-phase recrystallized by annealing treatment at approximately 600° C. The a-Si:H solid-phase is easily recrystallized at lower temperatures. This is because the presence of a large number of hydrogen atoms bonded to Si atoms facilitates the movement of the Si atoms.

(C2) Next, as illustrated in FIG. 3, a polycrystalline Si layer 15PS is formed by thermal annealing. Here, the amorphous Si layer 13AS is microcrystallized by low-temperature annealing and is further grown solid-phase recrystallized by thermal annealing, to form a thin film of the polycrystalline Si layer 15PS. The amorphous Si layer 13AS or the microcrystalline layer of Si is solid-phase recrystallized in a solid state. The amorphous Si layer 13AS is microcrystallized, grows grain crystalline, and is further polycrystallized in accordance with the temperature and time of the annealing treatment.

(D) Next, a bonding layer 17PI is coated on the whole surface of the polycrystalline Si layer 15PS, and a coated surface of the bonding layer 17PI is overlapped and bonded on one surface or both surfaces of a provisional substrate (graphite substrate 19GS) having an outside size larger by one size than the SiC single crystal substrate 10SB to form a first composite (19GS, 17PI, 15PS, 12RE, 11GR, and 10SB). In this case, an organic adhesive, such as a polyimide-based adhesive, for example, is used for the bonding layer 17PI. An epoxy-based organic adhesive may be used as other adhesives. Alternatively, an organic adhesive such as acrylic, such as, a Polymethyl methacrylate (PMMA) resin, may be used. As the provisional substrate having an outside size larger by one size, for example, with respect to an SiC single crystal substrate 10SB having a diameter of approximately 10 cm, a graphite substrate 19GS having a diameter of approximately 11 cm, i.e., an outside size larger by approximately 10 mm, may be used. For example, with respect to an SiC single crystal substrate 10SB having a diameter of approximately 15 cm, a graphite substrate 19GS having a diameter of an outside size of approximately 16 cm may be used. The graphite substrate 19GS may have a glassy carbon coating on the surface thereof. Since an adhesive strength of the glassy carbon coating with organic adhesives, such as a polyimide-based adhesive, is strong, it can easily remove the SiC epitaxial growth layer 12RE from the SiC single crystal substrate 10SB, thereby improving a yield rate. Alternatively, a metallic substrate having a high melting point, such as W or Mo, may be used instead of the graphite substrate 19GS. Alternatively, a silicon substrate, such as a sintered silicon substrate, or a sintered SiC substrate may be used instead of the graphite substrate 19GS. The use of a silicon substrate having an outside size larger by one size than the SiC single crystal substrate 10SB in this case is similar to the case of the graphite substrate 19GS.

(E1) The first composite is heated in a vacuum annealing furnace or the like, to dry cure the bonding layer 17PI.

(E2) Next, as illustrated in FIGS. 6A and 6B, on one surface or both surfaces of the first composite after curing, using an adhesive removing tape, a debonder device, or the like, the SiC single crystal substrate 10SB is physically removed to be separated from the graphene layer 11GR interface, and a second composite (19GS, 17PI, 15PS, and 12RE) including the SiC epitaxial growth layer 12RE is formed on one surface or both surfaces of the graphite substrate 19GS. The SiC epitaxial growth layer 12RE is bonded to the SiC single crystal substrate 10SB via the graphene layer 11GR, and therefore can be easily removed therefrom. Since the graphene layer 11GR is bonded to the front side surface of the SiC epitaxial growth layer 12RE by Van der Waals force, the second graphene layer 11GR2 can be easily removed therefrom by applying a force in the shearing direction.

(E3) On the other hand, the graphene layer 11GR on the SiC single crystal substrate 10SB is eliminated by etching or polishing. To an etching process of the graphene layer 11GR, for example, a plasma asher using oxygen plasma can be applied. Since a surface of the Si plane of the SiC single crystal substrate 10SB where the graphene layer 11GR is etched by oxygen plasma is oxidized and roughness is formed, wet etching with a hydrogen fluoride (HF) is performed. Moreover, in the polishing process of the graphene layer 11GR, the graphene layer is eliminated, for example by a Chemical Mechanical Polishing (CMP) method. In this case, the Si plane of the SiC single crystal substrate 10SB has an average surface roughness Ra of, for example, equal to or less than approximately 1 nm after performing the above-mentioned wet etching process. Consequently, the SiC single crystal substrate 10SB can be reused.

(E4) In addition, as illustrated in FIG. 11, a highly doped layer 12REN may be formed on the C plane of the SiC epitaxial growth layer 12RE. The highly doped layer 12REN suppresses a depletion layer spreading in the SiC epitaxial growth layer 12RE and also facilitates the ohmic contact with the SiC polycrystalline growth layer (CVD) 18PC formed on the C plane of the SiC epitaxial growth layer 12RE.

The highly doped layer 12REN can be formed, using, for example a high-dosage ion implantation technique. For example, in a case of an n type semiconductor, the highly doped layer 12REN is formed by ion implantation of phosphorus (P) with high dosage amount. In the case of forming the highly doped layer by phosphorus ion implantation, there is an effect on the crystallinity on the C plane of the SiC epitaxial growth layer 12RE subjected to the phosphorus ion implantation, but the Si plane to be a device surface has already been formed and therefore the crystallinity of the Si plane is preserved.

(E5) Alternatively, the highly doped layer 12REN may be formed by forming the highly nitrogen (N)-doped epitaxial growth layer in an initial stage during the formation of the SiC epitaxial growth layer (SiC-epi) 12RE illustrated in FIG. 1C. In the highly nitrogen (N)-doped epitaxial growth layer, there is an effect on crystallinity due to mismatching of lattice constant, but the process is easy since it is formed by autodoping in the initial stage of the epitaxial growth.

(F) Next, as illustrated in FIG. 7, the second composite (19GS, 17P11, 17P12, 15PS1, 15PS2, 12RE1, and 12RE2) is heated in a vacuum thermal annealing furnace, and the carbonized bonding layers 17PIC1 and 17PIC2 are formed. FIG. 7 illustrates an example of forming the SiC epitaxial growth layers 12RE1 and 12RE2 respectively on both surfaces of the graphite substrate 19GS.

(G) Next, as illustrated in FIG. 8, an SiC polycrystalline growth layer 18PC is formed on a (000-1) C surface of the SiC epitaxial growth layers 12RE1 and 12RE2 provided on one surface or both surfaces of the second composite. The SiC polycrystalline growth layer 18PC can be formed by, for example, CVD technique. The SiC polycrystalline growth layer 18PC has a 3C (cubic) structure. In the embodiment, the thickness of the SiC polycrystalline growth layer 18PC is, for example, approximately 100 μm to approximately 600 μm, and the thickness of the SiC epitaxial growth layer 12RE is, for example, approximately 4 μm to approximately 100 μm. A substrate layer of device wafer structure is formed by forming the SiC polycrystalline growth layer 18PC on the C plane of the SiC epitaxial growth layer 12RE. Since the C plane of the SiC epitaxial growth layer 12RE is a back surface of the device wafer structure, surface flatness thereof is not much required. Therefore, the SiC polycrystalline growth layer 18PC can be formed by a simple polishing process.

The SiC polycrystalline growth layer 18PC is deposited up to a thickness from which a mechanical strength required as a substrate of the SiC based semiconductor device can be obtained, to form a third composite (19GS, 17PIC1, 17PIC2, 15PS1, 15PS2, 12RE1, 12RE2, and 18PC). A film thickness of the SiC polycrystalline growth layer 18PC is preferably within a range from approximately 150 μm to approximately 500 μm, and is adjusted so that a substrate thickness of the completed composite substrate (SiC polycrystalline growth layer 18PC and the SiC epitaxial growth layer 12RE) is within a range from approximately 150 μm to approximately 500 μm as required. Thermal conductivity can be improved by reducing a film thickness of the SiC polycrystalline growth layer 18PC. Moreover, the deposition temperature of the SiC polycrystalline growth layer 18PC is set to be below the melting point of silicon, i.e., the temperature at which the polycrystallized Si thin film, i.e., polycrystalline Si layers 15PS1 and 15PS2, do not melt. The melting point of silicon is approximately 1414° C. The deposition temperature of SiC polycrystalline growth layer 18PC is preferably within a range from approximately 1000° C. to the melting point, in consideration of film quality. When the provisional substrate (graphite substrate 19GS) having an outside size larger by one size than the SiC single crystal substrate 10SB is inserted into a wafer boat groove of a batch-type vertical CVD furnace to be aligned, there is a advantage that a trace of a wafer boat support is outside a substrate effective area.

(H) Next, the unnecessary SiC polycrystalline growth layer 18PC deposited on the outer periphery of the third composite is eliminated by grinding to expose the provisional substrate (graphite substrate 19GS) and the carbonized bonding layers 17PIC1 and 17PIC2. Instead of grinding to eliminate the unnecessary SiC polycrystalline growth layer 18PC deposited on the outer periphery of the third composite, the provisional substrate (graphite substrate 19GS) may be cut along a plane illustrated along the line A-A of FIG. 8 parallel to the substrate surface to vertically separate the third composite. As a separation technique, for example, a wire saw or a diamond wire saw can be used.

(I) Next, as illustrated in FIG. 9, the third composite in which the outer periphery is ground or the third composite vertically separated is placed in a thermal annealing furnace with air or oxygen atmosphere and the graphite substrate 19GS inside the third composite and the carbonized bonding layer 17PIC1 and 17PIC2 is eliminated by oxidation combustion. It is extracted as a fourth composite (15PS1, 15PS2, 12RE1, 12RE2, and 18PC) including the SiC epitaxial growth layer 12RE on the SiC polycrystalline growth layer 18PC.

(J) Next, as illustrated in FIG. 10, the polycrystalline Si layers 15PS1 and 15PS2 are eliminated by grinding or polishing an outer periphery and both surfaces of the fourth composite, as well as processed to a size and a surface state required as a substrate.

In accordance with the above-mentioned processes, the semiconductor substrate according to the first embodiment can be formed.

In accordance with the fabrication method of the semiconductor substrate according to the first embodiment, before forming the SiC polycrystalline growth layer by the CVD method, the SiC single crystal substrate is separated and is replace by the high heat-resistant provisional substrate, and thereby it is possible to prevent unnecessary adhesion of the SiC polycrystal to the SiC single crystal substrate, to improve the reusability of the SiC single crystal substrate, and to reduce the cost.

In accordance with the fabrication method of the semiconductor substrate according to the first embodiment, the film internal stress generated when the amorphous Si layer or the microcrystalline layer of Si is polycrystallized by the solid-phase recrystallization growth is utilized to make it easier to remove the SiC epitaxial growth layer from the graphene layer, and thereby it is possible to avoid the metallic contamination which becomes a problem when the metal stressor film is used.

In accordance with the fabrication method of the semiconductor substrate according to the first embodiment, the high heat-resistant provisional substrate having a size larger by one size than the SiC single crystal substrate is used, and thereby it is possible to realize the single or double-sided epitaxial growth using the epitaxial growth apparatus, such as the batch-type vertical tubular furnace, and to realize high throughput and low cost production without increasing the growth rate.

In accordance with the fabrication method of the semiconductor substrate according to the first embodiment, the high heat-resistant substrates, such as a graphite substrate, and the bonding layer are carbonized, and thereby it can be separated in affordable price merely by firing the semiconductor substrate structure formed in both surfaces of the graphite substrate in the oxidation furnace.

In accordance with the semiconductor substrate according to the first embodiment and the fabrication method thereof, the remote epitaxial growth of SiC is performed via the graphene formed to the SiC single crystal substrate and the SiC polycrystalline growth layer is directly formed thereon by the CVD method, substrate bonding is no linger necessary, and defects caused by the substrate bonding can be eliminated. Moreover, since the epitaxial growth layer is formed via the graphene, separation between the SiC single crystal substrate and the epitaxial growth layer becomes easier, thereby simplifying the processing processes, and eliminating the need for expensive process such as ion implantation removing method or the like.

In accordance with the semiconductor substrate according to the first embodiment and the fabrication method thereof, after the SiC single crystal substrate is eliminated, the whole high heat-resistant handle substrate is inserted into the high-temperature LP-CVD apparatus to grow up the SiC polycrystalline growth layer directly on the epitaxial growth layer, and thereby it is possible to eliminate the process of transporting the epitaxial growth layer of several μm thickness from the handle substrate to the support substrate and the process of being bonded to the support substrate an of several μm film thickness, and to avoid failures, such as wrinkles, crystal transitions, and voids, caused by the thin film transportation and bonding.

In accordance with the semiconductor substrate according to the first embodiment and the fabrication method thereof, the graphene layer formed on the SiC single crystal substrate is not transferred, and the epitaxial growth is performed thereon as it is. Consequently, it is possible to avoid failures, such as wrinkles and cracks, caused by the transfer of the graphene.

In accordance with the semiconductor substrate according to the first embodiment and the fabrication method thereof, since the SiC substrate is used as a base, the hexagonal SiC with less crystallinity degradation can be obtained. Although the SiC substrate is expensive and difficult to be eliminated by polishing or etching, it is easy to separate the obtained high-performance single crystal layer by using the remote epitaxial growth via the graphene, and thereby eliminating the need for elimination by polishing or etching. Since such an expensive single crystal SiC seed substrate can be reused after the separating, a significant cost advantage can be provided.

Second Embodiment (Semiconductor Substrate)

Figure 12:
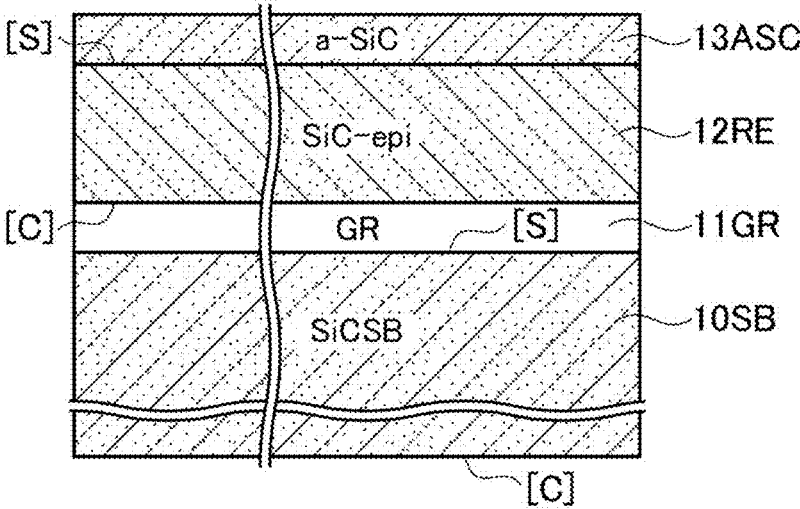
FIG. 12 illustrates a fabrication method of a semiconductor substrate according to the second embodiment, which illustrates a cross-sectional diagram of a structure in which an amorphous SiC layer is formed on the SiC epitaxial growth layer.

As illustrated in FIG. 12, a semiconductor substrate according to the second embodiment includes: an SiC single crystal substrate (SiCSB) 10SB; a graphene layer (GR)11GR disposed on an Si plane of the SiC single crystal substrate 10SB; an SiC epitaxial growth layer (SiC-epi) 12RE formed on the SiC single crystal substrate 10SB via the graphene layer 11GR; and an amorphous layer formed on the SiC epitaxial growth layer 12RE.

In the present embodiment, the amorphous layer includes an amorphous SiC layer (a-SiC) 13ASC. Alternatively, it may include a microcrystalline layer of SiC instead of the amorphous SiC layer 13ASC.

Figure 13:
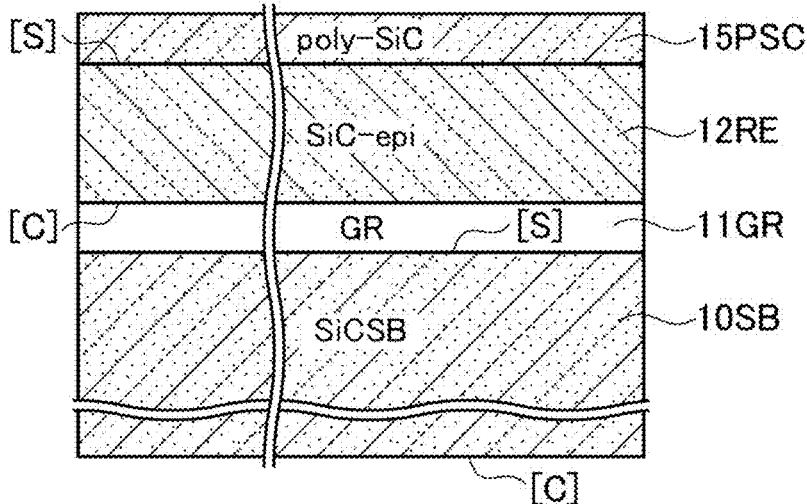
FIG. 13 illustrates the fabrication method of the semiconductor substrate according to the second embodiment, which illustrates a cross-sectional diagram of a structure in which the amorphous SiC layer is polycrystallized by annealing treatment and the polycrystalline SiC layer is formed on the SiC epitaxial growth layer.

Alternatively, as illustrated in FIG. 13, the semiconductor substrate according to the second embodiment may include: an SiC single crystal substrate 10SB; a graphene layer 11GR disposed on an Si plane of the SiC single crystal substrate 10SB; an SiC epitaxial growth layer 12RE formed on the SiC single crystal substrate 10SB via the graphene layer 11GR; and a polycrystalline layer formed on the SiC epitaxial growth layer 12RE.

In the present embodiment, the polycrystalline layer includes a polycrystal SiC layer (poly-SiC) 15PSC.

Figure 14A:
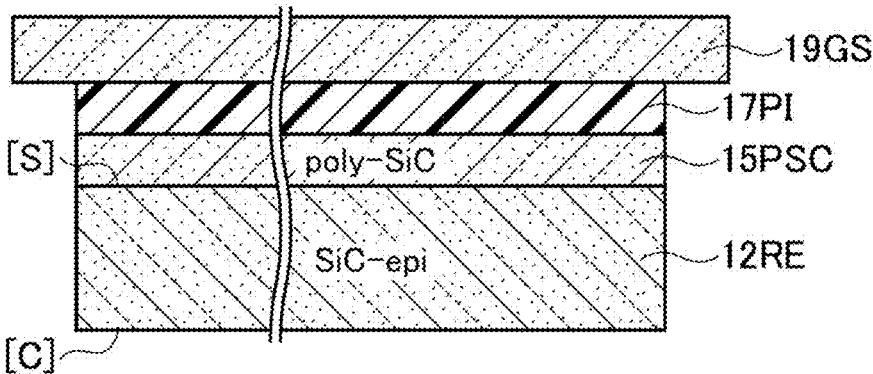
FIG. 14A illustrates the fabrication method of the semiconductor substrate according to the second embodiment, which illustrates a cross-sectional diagram of the SiC epitaxial growth layer side of a structure in which a graphite substrate is bonded via a bonding layer on the polycrystalline SiC layer and the SiC single crystal substrate is removed at an interface between the SiC epitaxial growth layer and the graphene layer.

Alternatively, as illustrated in FIG. 14A, the semiconductor substrate according to the second embodiment may include: an SiC epitaxial growth layer 12RE; a polycrystal SiC layer 15PSC disposed on the SiC epitaxial growth layer 12RE; and a graphite substrate 19GS disposed on the polycrystal SiC layer 15PSC. In the present embodiment, the Graphite substrate 19GS is connected onto the polycrystal SiC layer 15PSC via the bonding layer 17PI. Alternatively, it may include a silicon substrate instead of the graphite substrate 19GS. In this case, an organic adhesive, such as a polyimide-based adhesive, for example, is used for the bonding layer 17PI.

Figure 15:
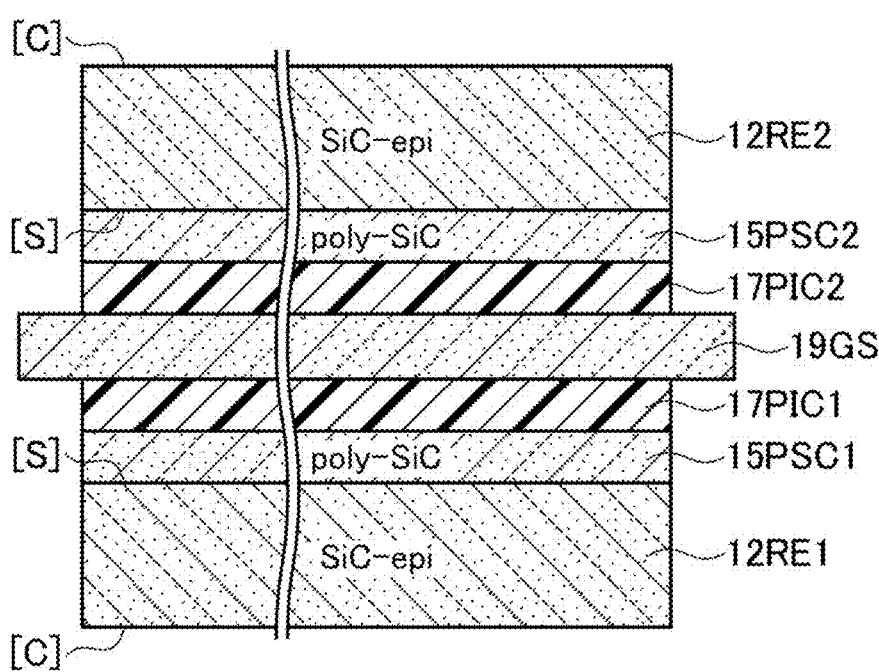
FIG. 15 illustrates the fabrication method of the semiconductor substrate according to the second embodiment, which illustrates a cross-sectional diagram of a structure in which the removed structure illustrated in FIG. 14A is bonded on both surfaces of the graphite substrate and a bonding layer carbonized by annealing treatment is formed.

Alternatively, as illustrated in FIG. 15, the semiconductor substrate structure according to the second embodiment may includes a configuration in which the semiconductor substrate illustrated in FIG. 14A is disposed on both surfaces of the graphite substrate 19GS.

Figure 16:
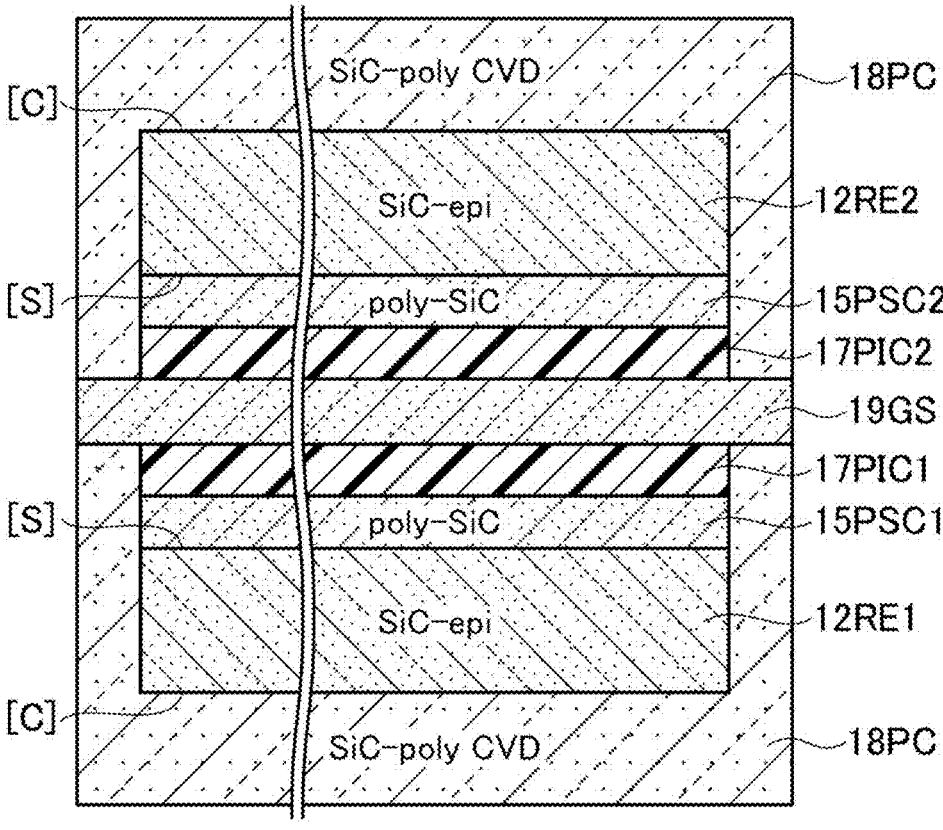
FIG. 16 illustrates the fabrication method of the semiconductor substrate according to the second embodiment, which illustrates a cross-sectional diagram of a structure in which an SiC polycrystalline growth layer is formed by a CVD method and an outer periphery thereof is ground.
Figure 17:
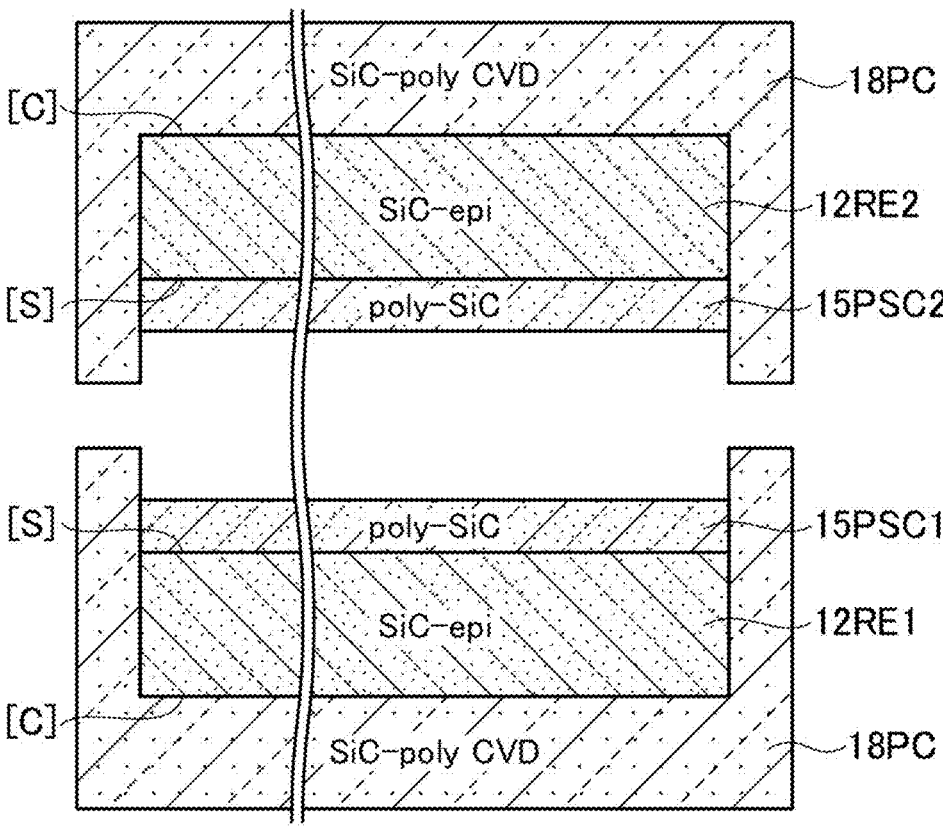
FIG. 17 illustrates the fabrication method of the semiconductor substrate according to the second embodiment, which illustrates a cross-sectional diagram of a structure in which the graphite substrate and the carbonized bonding layer are sublimated by annealing treatment.

Alternatively, as illustrated in FIGS. 16-17 and 10, the semiconductor substrate according to the second embodiment may includes an SiC polycrystalline growth layer 18PC grown by CVD on a C plane of each the SiC epitaxial growth layers 12RE1 and 12RE2. The SiC epitaxial growth layers 12RE1 and 12RE2 are transferred to the SiC polycrystalline growth layer 18PC.

Alternatively, the graphene layer 11GR may includes a single-layer structure or multi-layer laminated structure of graphene. The SiC epitaxial growth layers 12RE, 12RE1, 12RE2 are formed on the SiC single crystal substrate 10SB via the graphene layer 11GR by remote epitaxial growth. The SiC single crystal substrate 10SB can be reused by being removed from the epitaxial growth layer 12RE.

(Fabrication Method)

In a fabrication method of the semiconductor substrate according to the second embodiment, a cross-sectional diagram of the SiC single crystal substrate 10SB is similarly illustrated as FIG. 1A, a cross-sectional diagram of a structure in which the graphene layer 11GR is formed on the SiC single crystal substrate 10SB is similarly illustrated as FIG.

1B, and a cross-sectional diagram of a structure in which the SiC epitaxial growth layer 12RE is formed on the graphene layer 11GR is similarly illustrated as FIG. 1C.

In the fabrication method of the semiconductor substrate 1 according to the second embodiment, FIG. 12 illustrates a cross-sectional diagram of a structure in which the amorphous SiC layer 13ASC is formed on the SiC epitaxial growth layer 12RE.

FIG. 13 illustrates the fabrication method of the semiconductor substrate according to the second embodiment, which illustrates a cross-sectional diagram of a structure in which an amorphous SiC layer 13ASC is polycrystallized by annealing treatment and the polycrystalline SiC layer 15PSC is formed on the SiC epitaxial growth layer 12RE.

Figure 14B:
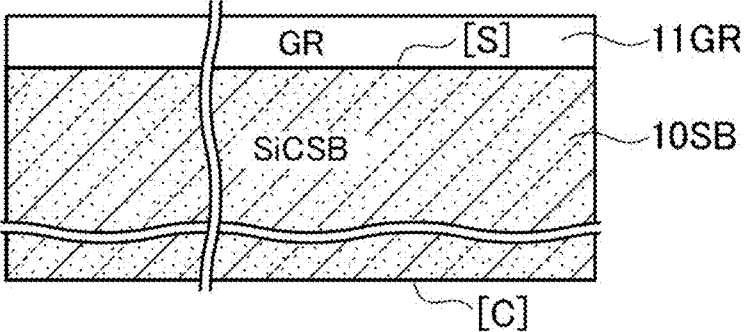
FIG. 14B illustrates the fabrication method of the semiconductor substrate according to the second embodiment, which illustrates a cross-sectional diagram of the graphene layer side of a structure in which a graphite substrate is bonded via a bonding layer on the polycrystalline SiC layer and the SiC single crystal substrate is removed at an interface between the SiC epitaxial growth layer and the graphene layer.

FIG. 14A illustrates the fabrication method of the semiconductor substrate according to the second embodiment, which illustrates a cross-sectional diagram of the SiC epitaxial growth layer 12RE side of a structure in which a graphite substrate 19GS is bonded via a bonding layer 17PI on the polycrystalline SiC layer 15PSC and the SiC single crystal substrate is removed at an interface between the SiC epitaxial growth layer 12RE and the graphene layer 11GR. A cross-sectional diagram at the graphene layer 11GR side is illustrated as illustrated in FIG. 14B.

FIG. 15 illustrates the fabrication method of the semiconductor substrate according to the second embodiment, which illustrates a cross-sectional diagram of a structure in which the removed structure illustrated in FIG. 14A is bonded on both surfaces of the graphite substrate 19GS and bonding layers 17PIC1 and 17PIC2 carbonized by annealing treatment are formed.

FIG. 16 illustrates the fabrication method of the semiconductor substrate according to the second embodiment, which illustrates a cross-sectional diagram of a structure in which an SiC polycrystalline growth layer 18PC is formed by a CVD method and an outer periphery thereof is ground.

FIG. 17 illustrates the fabrication method of the semiconductor substrate according to the second embodiment, which illustrates a cross-sectional diagram of a structure in which the graphite substrate 19GS and the carbonized bonding layers 17PIC1 and 17PIC2 are sublimated by annealing treatment.

In the fabrication method of the semiconductor substrate according to the second embodiment, there is a cross-sectional diagram of a structure in which the SiC polycrystalline growth layer 18PC and the poly SiC layers 15PSC1 and 15PSC2 are eliminated and the SiC epitaxial growth layers 12RE1 and 12RE2 are respectively provided on the SiC polycrystalline growth layers 18PC, as similarly illustrated to FIG. 10.

In the fabrication method of the semiconductor substrate according to the second embodiment, there is a cross-sectional diagram of a structure in which a highly doped layer 12REN is provided at an interface between the SiC polycrystalline growth layer 18PC and the SiC epitaxial growth layer 12RE, as similarly illustrated to FIG. 11.

The fabrication method of the semiconductor substrate according to the second embodiment includes the following processes. More specifically, included are: forming a graphene layer 11GR on an Si plane of an SiC single crystal substrate 10SB; forming an SiC epitaxial growth layer 12RE on the graphene layer 11GR; forming an amorphous Si layer 13AS on the SiC epitaxial growth layer 12RE; applying annealing treatment to the amorphous Si layer 13AS so as to be polycrystallized and forming a polycrystalline Si layer 15PS on the SiC epitaxial growth layer 12RE; bonding a provisional substrate on the polycrystalline Si layer 15PS;

removing the SiC single crystal substrate 10SB from the graphene layer 11GR; forming an SiC polycrystalline growth layer 18PC on a C plane of the SiC epitaxial growth layer 12RE; exposing the provisional substrate, applying annealing treatment to the provisional substrate so as to be sublimated; and eliminating the polycrystalline Si layer 15PS.

Hereinafter, the fabrication method of the semiconductor substrate according to the second embodiment will be described in detail with reference to drawings. It is to be noted that the description overlapping with the description of the fabrication method of the semiconductor substrate according to the first embodiment will be omitted.

(K) First, as similarly illustrated in FIGS. 1A and 1B, a graphene layer 11GR up to several molecular layers is formed on a (0001) Si plane of a hexagonal SiC single crystal substrate 10SB serving as a seed substrate.

(L) Next, as similarly illustrated in FIG. 1C, an SiC epitaxial growth layer 12RE is formed by a remote epitaxial growth method on the graphene layer 11GR formed on the SiC single crystal substrate 10SB. The SiC epitaxial growth layer 12RE is a single crystal SiC thin film.

(M1) Next, as illustrated in FIG. 12, an amorphous SiC layer 13ASC is formed on the SiC epitaxial growth layer 12RE.

(M2) Next, as illustrated in FIG. 13, a polycrystalline SiC layer 15PSC is formed by thermal annealing. Here, an SiC thin film having a micro crystallite structure is formed by applying thermal annealing to the amorphous SiC layer 13ASC and is further grown solid-phase recrystallized by thermal annealing, to form a thin film of the polycrystalline SiC layer 15PSC. In the a-SiC film, the solid-phase crystallization requires high temperatures than in the a-Si film, e.g., approximately 1000° C. higher.

(N) Next, a bonding layer 17PI is coated on the whole surface of the polycrystalline SiC layer 15PSC, and a coated surface of the bonding layer 17PI is overlapped and bonded on one surface or both surfaces of a provisional substrate (graphite substrate 19GS) composed of a graphite material having a size larger by one size than the SiC single crystal substrate 10SB to form a first composite (19GS, 17PI, 15PSC, 12RE, 11GR, and 10SB). In this case, an organic adhesive, such as a polyimide-based adhesive, for example, is used for the bonding layer 17PI. Organic adhesives, such as epoxy-based adhesive or acrylic adhesive, may be used as other adhesives.

(O1) The first composite is heated in a vacuum annealing furnace or the like, to dry cure the organic bonding layer 17PI.

(O2) Next, as illustrated in FIGS. 14A and 14B, on one surface or both surfaces of the first composite after curing, using an adhesive removing tape, a debonder device, or the like, the SiC single crystal substrate 10SB is physically removed to be separated from the graphene layer 11GR interface, and a second composite (19GS, 17PI, 15PSC, and 12RE) including the SiC epitaxial growth layer 12RE is formed on one surface or both surfaces of the graphite substrate 19GS. The SiC epitaxial growth layer 12RE is bonded to the SiC single crystal substrate 10SB via the graphene layer 11GR, and therefore can be easily removed therefrom. Since the graphene layer 11GR is bonded to the front side surface of the SiC epitaxial growth layer 12RE by Van der Waals force, the second graphene layer 11GR2 can be easily removed therefrom by applying a force in the shearing direction.

(O3) On the other hand, the graphene layer 11GR on the SiC single crystal substrate 10SB is eliminated by etching or polishing. To an etching process of the graphene layer 11GR, for example, a plasma asher using oxygen plasma can be applied. Since a surface of the Si plane of the SiC single crystal substrate 10SB where the graphene layer 11GR is etched by oxygen plasma is oxidized and roughness is formed, wet etching with a hydrogen fluoride (HF) is performed. Moreover, in the polishing process of the graphene layer 11GR, the graphene layer is eliminated, for example, by the CMP method. In this case, the Si plane of the SiC single crystal substrate 10SB has an average surface roughness Ra of, for example, equal to or less than approximately 1 nm after performing the above-mentioned wet etching process. Consequently, the SiC single crystal substrate 10SB can be reused.

(O4) In addition, as illustrated in FIG. 11, a highly doped layer 12REN may be formed on the C plane of the SiC epitaxial growth layer 12RE. The highly doped layer 12REN suppresses a depletion layer spreading in the SiC epitaxial growth layer 12RE and also facilitates the ohmic contact with the SiC polycrystalline growth layer (CVD) 18PC formed on the C plane of the SiC epitaxial growth layer 12RE.

The highly doped layer 12REN can be formed, using, for example a high-dosage ion implantation technique. For example, in a case of an n type semiconductor, the highly doped layer 12REN is formed by ion implantation of phosphorus (P) with high dosage amount. In the case of forming the highly doped layer by phosphorus ion implantation, there is an effect on the crystallinity on the C plane of the SiC epitaxial growth layer 12RE subjected to the phosphorus ion implantation, but the Si plane to be a device surface has already been formed and therefore the crystallinity of the Si plane is preserved.

(O5) Alternatively, the highly doped layer 12REN may be formed by forming the highly nitrogen (N)-doped epitaxial growth layer in an initial stage during the formation of the SiC epitaxial growth layer (SiC-epi) 12RE illustrated in FIG. 1C. In the highly nitrogen (N)-doped epitaxial growth layer, there is an effect on crystallinity due to mismatching of lattice constant, but the process is easy since it is formed by autodoping in the initial stage of the epitaxial growth.

(P) Next, as illustrated in FIG. 15, the second composite (19GS, 17P11, 17P12, 15PSC1, 15PSC2, 12RE1, and 12RE2) is heated in a vacuum thermal annealing furnace, and the carbonized bonding layers 17PIC1 and 17PIC2 are formed. Here, FIG. 15 illustrates an example of forming the SiC epitaxial growth layers 12RE1 and 12RE2 respectively on both surfaces of the graphite substrate 19GS.

(Q) Next, as illustrated in FIG. 16, an SiC polycrystalline growth layer 18PC is formed, by using the thermal CVD method or the like, on a (000-1) C surface of the SiC epitaxial growth layers 12RE1 and 12RE2 provided on one surface or both surfaces of the second composite. The SiC polycrystalline growth layer 18PC is deposited up to a thickness from which a mechanical strength required as a substrate of the SiC based semiconductor device can be obtained, to form a third composite (19GS, 17P11, 17P12, 15PSC1, 15PSC2, 12RE1, 12RE2, and 18PC). A film thickness of the SiC polycrystalline growth layer 18PC is preferably within a range from approximately 150 μm to approximately 500 μm, and is adjusted so that a substrate thickness of the completed composite substrate (SiC polycrystalline growth layer 18PC and the SiC epitaxial growth layer 12RE) is within a range from approximately 150 μm to approximately 500 μm as required. The deposition temperature of the polycrystal SiC is the temperature at which the silicon material does not melt if the provisional substrate is a silicon material, i.e., lower than the melting point of silicon, and if the provisional substrate is a carbon material, the temperature equal to or higher than the melting point of silicon. When the provisional substrate having an outside size larger by one size than the SiC single crystal substrate 10SB is inserted into a wafer boat groove of a batch-type vertical CVD furnace to be aligned, there is a advantage that a trace of a wafer boat support is outside a substrate effective area.

(R) Next, the unnecessary SiC polycrystalline growth layer 18PC deposited on the outer periphery of the third composite is eliminated by grinding to expose the provisional substrate (graphite substrate 19GS) and the carbonized bonding layers 17PIC1 and 17PIC2. Instead of grinding to eliminate the unnecessary SiC polycrystalline growth layer 18PC deposited on the outer periphery of the third composite, the provisional substrate (graphite substrate 19GS) may be cut parallel to the substrate surface to vertically separate the third composite. As a separation technique, for example, a wire saw or a diamond wire saw can be used.

(S) Next, as illustrated in FIG. 17, the third composite in which the outer periphery is ground is placed in a thermal annealing furnace with air or oxygen atmosphere and the graphite substrate 19GS inside the third composite and the carbonized bonding layer 17PIC1 and 17PIC2 is sublimated and eliminated by combustion, and is extracted as a fourth composite (15PSC1, 15PSC2, 12RE1, 12RE2, and 18PC) including the SiC epitaxial growth layer 12RE on the SiC polycrystalline growth layer 18PC.

(T) Next, as illustrated in FIG. 10, the polycrystalline SiC layers 15PSC1 and 15PSC2 are eliminated by grinding or polishing an outer periphery and both surfaces of the fourth composite, as well as processed to a size and a surface state required as a substrate.

In accordance with the above-mentioned processes, the semiconductor substrate according to the second embodiment can be formed.

In accordance with the fabrication method of the semiconductor substrate according to the second embodiment, before forming the SiC polycrystalline growth layer by the CVD, the SiC single crystal substrate is separated and is replace by the high heat-resistant provisional substrate, and thereby it is possible to prevent unnecessary adhesion of the SiC polycrystal to the SiC single crystal substrate, to improve the reusability of the SiC single crystal substrate 10SB, and to reduce the cost.

In accordance with the fabrication method of the semiconductor substrate according to the second embodiment, the film internal stress generated when the amorphous SiC layer or the microcrystalline layer of SiC is polycrystallized by the solid-phase recrystallization growth is utilized to make it easier to remove the SiC epitaxial growth layer from the graphene layer, and thereby it is possible to avoid the metallic contamination which becomes a problem when the metal stressor film is used.

In accordance with the fabrication method of the semiconductor substrate according to the second embodiment, the high heat-resistant provisional substrate having a size larger by one size than the SiC single crystal substrate is used, and thereby it is possible to realize the single or double-sided epitaxial growth using the epitaxial growth apparatus, such as the batch-type vertical tubular furnace, and to realize high throughput and low cost production without increasing the growth rate.

In accordance with the fabrication method of the semiconductor substrate according to the second embodiment, the high heat-resistant substrates, such as a graphite substrate, and the bonding layer are carbonized, and thereby it can be separated in affordable price merely by firing the semiconductor substrate structure formed in both surfaces of the graphite substrate in the oxidation furnace.

In accordance with the semiconductor substrate according to the second embodiment and the fabrication method thereof, the remote epitaxial growth of SiC is performed via the graphene formed to the SiC single crystal substrate and the SiC polycrystalline growth layer is directly formed thereon, substrate bonding is no linger necessary, and defects caused by the substrate bonding can be eliminated. Moreover, since the epitaxial layer is formed via the graphene, separation between the SiC single crystal substrate and the epitaxial growth layer becomes easier, thereby simplifying the crystalline layer forming process processes, and eliminating the need for expensive process such as ion implantation removing method or the like.

In accordance with the semiconductor substrate according to the second embodiment and the fabrication method thereof, after the SiC single crystal substrate is eliminated, the whole high heat-resistant handle substrate is inserted into the high-temperature LP-CVD apparatus to grow up the SiC polycrystalline growth layer directly on the epitaxial growth layer, and thereby it is possible to eliminate the process of transporting the epitaxial growth layer of several μm thickness from the handle substrate to the support substrate and the process of being bonded to the support substrate an of several μm film thickness, and to avoid failures, such as wrinkles, crystal transitions, and voids, caused by the thin film transportation and bonding.

In accordance with the semiconductor substrate according to the second embodiment and the fabrication method thereof, the graphene layer formed on the SiC single crystal substrate is not transferred, and the epitaxial growth is performed thereon as it is, and thereby it is possible to avoid failures, such as wrinkles and cracks, caused by the transfer of the graphene.

In accordance with the semiconductor substrate according to the second embodiment and the fabrication method thereof, since the SiC single crystal substrate is used as a base, the hexagonal SiC with less crystallinity degradation can be obtained. Although the SiC single crystal substrate is expensive and difficult to be eliminated by polishing or etching, it is easy to separate the obtained high-performance single crystal epitaxial growth layer by using the remote epitaxial growth via the graphene, and thereby eliminating the need for elimination by polishing or etching. Since such an expensive single crystal SiC substrate can be reused after the separating, a significant cost advantage can be provided.

(Graphene Layer)

Figure 18:
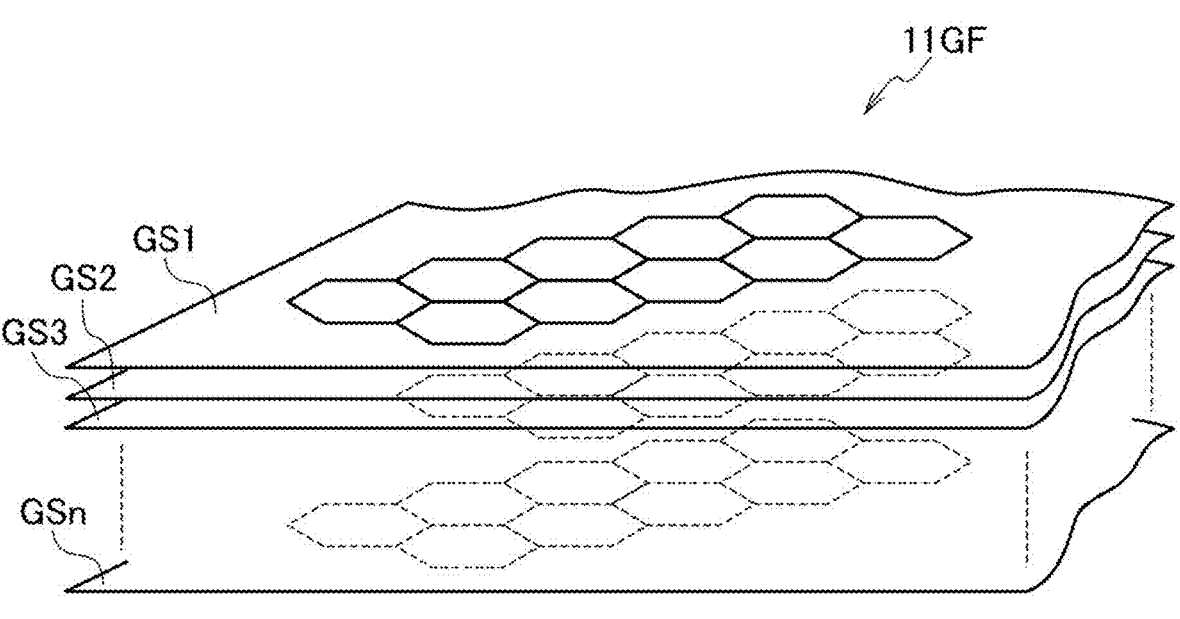
FIG. 18 illustrates a bird's-eye view of an example of a graphene layer applicable to the fabrication method for the semiconductor substrate according to the embodiments, which is provided with a configuration in which a plurality of layers are laminated.
Figure 18:
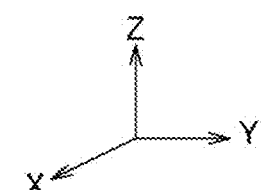

The graphene layer 11GR applicable to the fabrication method of the semiconductor substrate according to the embodiments may include a single-layer structure, or may include a configuration obtained by laminating a plurality of layers. FIG. 18 illustrates a bird's-eye view an example of the graphene layer applicable to the fabrication method for the semiconductor substrate according to the embodiments, which is provided with a configuration in which a plurality of layers are laminated.

A graphene layer 11GF provided with a configuration obtained by laminating a plurality of layers includes a laminated structure of graphite sheets GS1, GS2, GS3, GSn, as illustrated in FIG. 18. The graphite sheets GS1, GS2, GS3, GSn of respective planes composed of n layers have a large number of hexagonal carbon (C) covalent bonds in one laminated crystal structure, and the graphite sheets GS1, GS2, GS3, GSn of the respective plane are bonded to each other by Van der Waals force.

(Semiconductor Substrate)

As illustrated in FIG. 11, the semiconductor substrate 1 according to the embodiments includes the SiC epitaxial growth layer 12RE, and the SiC polycrystalline growth layer 18PC disposed on the C plane of the SiC epitaxial growth layer 12RE.

The surface of the SiC epitaxial growth layer 12RE is an Si plane of [0001] orientation of 4H—SiC, and the C plane of the first layer is a plane of [000-1] orientation of 4H—SiC.

The SiC epitaxial growth layer 12RE may includes a highly doped layer 12REN having higher impurity concentration than the SiC epitaxial growth layer 12RE on the C plane in contact with the SiC polycrystalline growth layer 18PC.

The semiconductor substrate 1 according to the embodiments can be applied to fabrication of, for example, various SiC-based semiconductor elements. The following describes examples of SiC Schottky Barrier Diodes (SiC-SBDs), SiC Trench-gate type Metal Oxide Semiconductor Field Effect Transistors (SiC-TMOSFETs), and SiC planar-gate type MOSFETs, as examples of the various SiC semiconductor elements.

(SiC-SBD)

Figure 19:
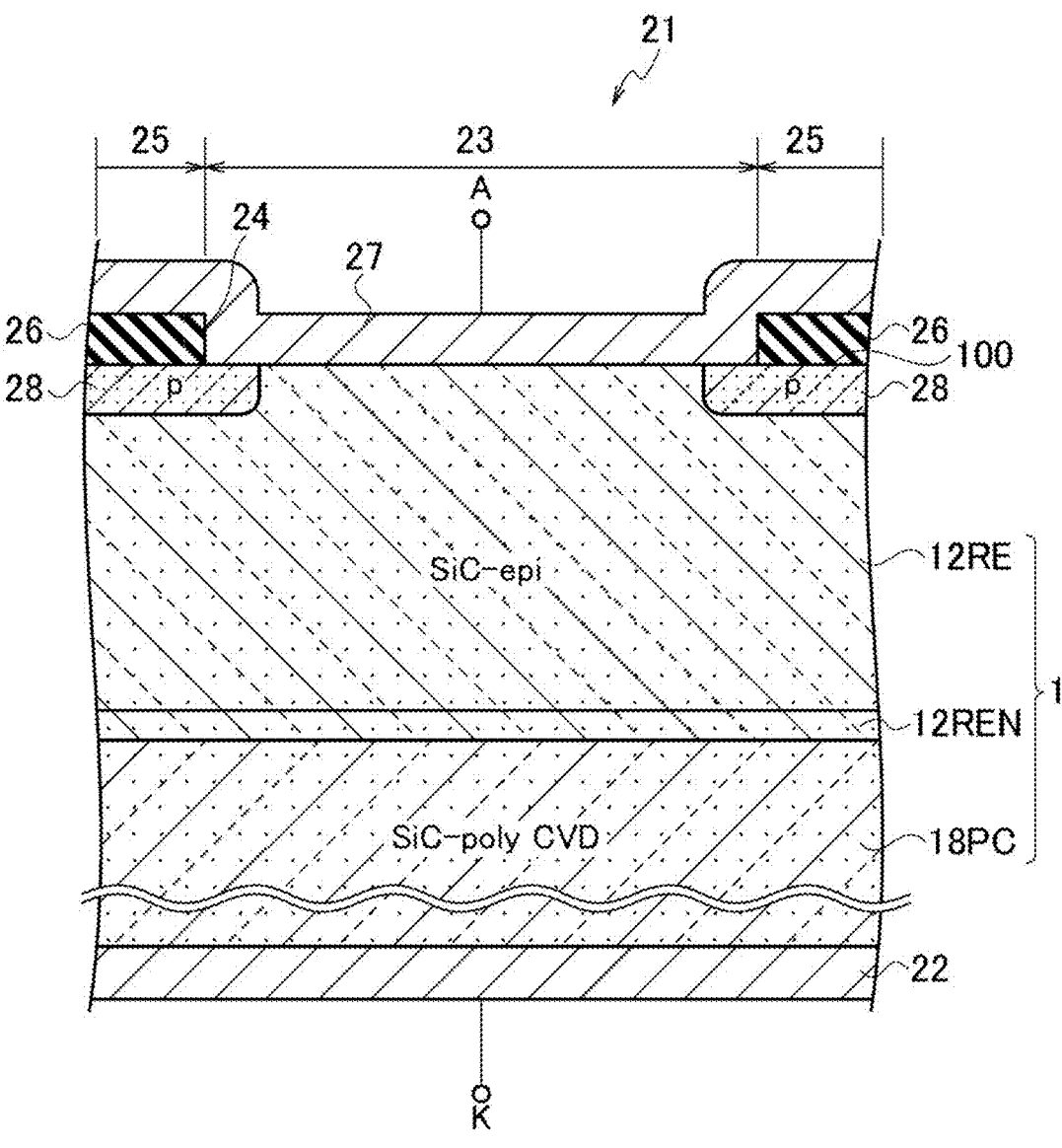
FIG. 19 illustrates a cross-sectional diagram illustrating a Schottky barrier diode fabricated using the semiconductor substrate according to the embodiments.

As a semiconductor device fabricated using the semiconductor substrate according to the embodiments, an SiC-SBD 21 includes a semiconductor substrate 1 including an SiC polycrystalline growth layer (CVD) 18PC and an SiC epitaxial growth layer 12RE, as illustrated in FIG. 19. In addition, a highly doped layer 12REN may be interposed between the SiC polycrystalline growth layer 18PC and the SiC epitaxial growth layer 12RE. In this case, the highly doped layer 12REN suppresses a depletion layer spreading in the SiC epitaxial growth layer 12RE and also facilitates the ohmic contact with the SiC polycrystalline growth layer 18PC formed on the C plane of the SiC epitaxial growth layer 12RE. The SiC epitaxial growth layer 12RE is a drift layer, the highly doped layer 12REN is a buffer layer, and the SiC polycrystalline growth layer 18PC is a substrate layer.

The SiC polycrystalline growth layer 18PC is doped into an $n^+$ type (of which an impurity density is, for example, approximately $1\times10^{18}$ cm$^{-3}$ to approximately $1\times10^{21}$ cm$^{-3}$), and the SiC epitaxial growth layer 12RE is doped into an $n^-$ type (of which an impurity density is, for example, approximately $5\times10^{14}$ cm$^{-3}$ to approximately $5\times10^{16}$ cm$^{-3}$). The highly doped layer 12REN is doped at higher concentration than that of the SiC epitaxial growth layer 12RE.

Moreover, the SiC epitaxial growth layer 12RE may contain one crystal structure selected from a group consisting of 4H—SiC, 6H—SiC, and 2H—SiC crystal structures.

As an n type doping impurity, for example, nitrogen (N), phosphorus (P), arsenic (As), or the like can be applied.

As a p type doping impurity, for example, boron (B), aluminum (Al), TMA, or the like can be applied.

A back side surface ((000-1) C plane) of the SiC polycrystalline growth layer 18PC includes a cathode electrode 22 so as to cover the whole region of the back side surface, and the cathode electrode 22 is connected to a cathode terminal K.

A front side surface 100 ((0001) Si plane) of the SiC epitaxial growth layer 12 includes a contact hole 24 to which a part of the SiC epitaxial growth layer 12RE is exposed as an active region 23, and a field insulating film 26 is formed at a field region 25 which surrounding the active region 23.

Although the field insulating film 26 includes silicon oxide (SiO$_2$), the field insulating film 26 may include other insulating materials, e.g., silicon nitride (SiN). An anode electrode 27 is formed on the field insulating film 26, and the anode electrode 27 is connected to an anode terminal A.

Near the front side surface 100 (surface portion) of the SiC epitaxial growth layer 12, a p type Junction Termination Extension (JTE) structure 28 is formed so as to be contacted with the anode electrode 27. The JTE structure 28 is formed along an outline of the contact hole 24 so as to extend from the outside to inside of the contact hole 24 of the field insulating film 26.

(SiC-TMOSFET)

Figure 20:
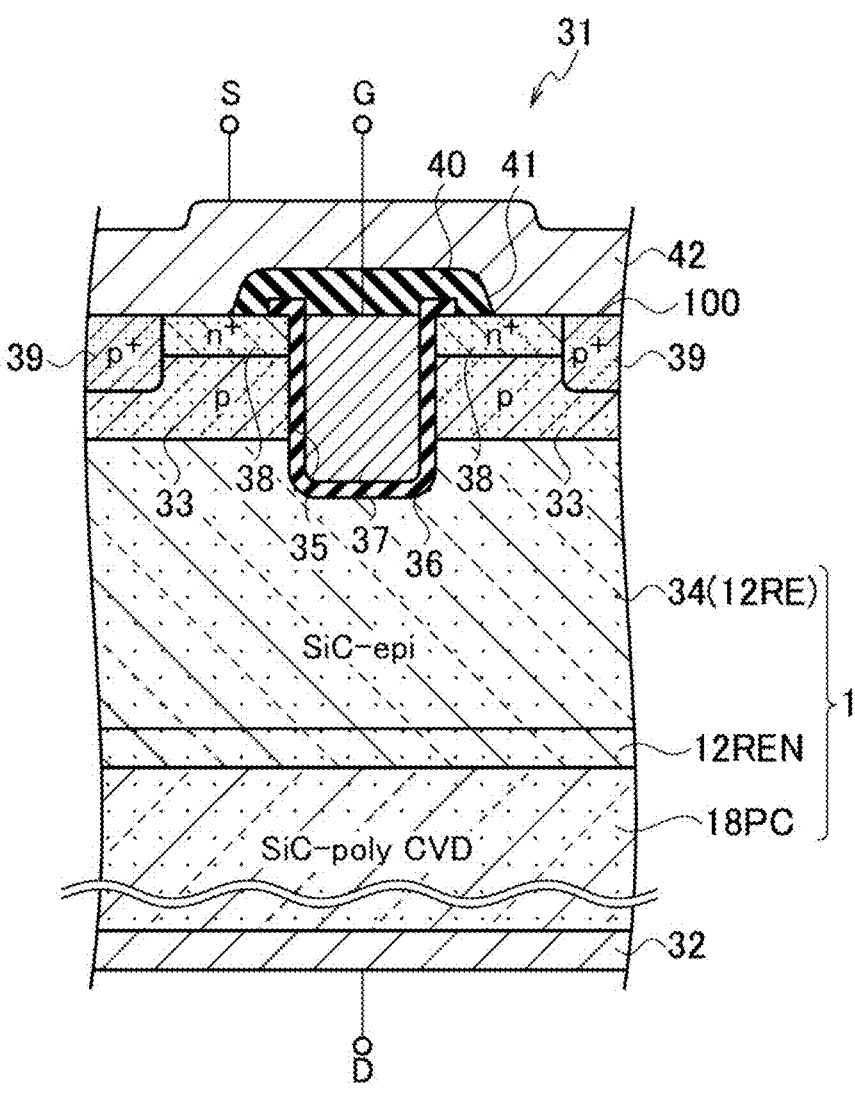
FIG. 20 illustrates a cross-sectional diagram illustrating a trench-gate type MOSFET fabricated using the semiconductor substrate according to the embodiments.

As a semiconductor device fabricated using the semiconductor substrate according to the embodiments, a trench-gate type MOSFET 31 includes a semiconductor substrate 1 including an SiC polycrystalline growth layer 18PC and an SiC epitaxial growth layer 12RE, as illustrated in FIG. 20. In addition, a highly doped layer 12REN may be interposed between the SiC polycrystalline growth layer 18PC and the SiC epitaxial growth layer 12RE. In this case, the highly doped layer 12REN suppresses a depletion layer spreading in the SiC epitaxial growth layer 12RE and also facilitates the ohmic contact with the SiC polycrystalline growth layer 18PC formed on the C plane of the SiC epitaxial growth layer 12RE. The SiC epitaxial growth layer 12RE is a drift layer, the highly doped layer 12REN is a buffer layer, and the SiC polycrystalline growth layer 18PC is a substrate layer.

The SiC polycrystalline growth layer 18PC is doped into an $n^+$ type (of which an impurity density is, for example, approximately $1\times10^{18}$ cm$^{-3}$ to approximately $1\times10^{21}$ cm$^{-3}$), and the SiC epitaxial growth layer 12RE is doped into an $n^-$ type (of which an impurity density is, for example, approximately $5\times10^{14}$ cm$^{-3}$ to approximately $5\times10^{16}$ cm$^{-3}$). The highly doped layer 12REN is doped at higher concentration than that of the SiC epitaxial growth layer 12RE.

Moreover, the SiC epitaxial growth layer 12RE may contain one crystal structure selected from a group consisting of 4H—SiC, 6H—SiC, and 2H—SiC crystal structures.

As an n type doping impurity, for example, nitrogen (N), phosphorus (P), arsenic (As), or the like can be applied.

As a p type doping impurity, for example, boron (B), aluminum (Al), TMA, or the like can be applied.

A back side surface ((000-1) C plane) of the SiC polycrystalline growth layer 18PC includes a drain electrode 32 so as to cover the whole region of the back side surface, and the drain electrode 32 is connected to a drain terminal D.

Near the front side surface 100 ((0001) Si plane) (surface portion) of the SiC epitaxial growth layer 12RE, a p type body region 33 (of which an impurity concentration is, for example, approximately $1\times10^{16}$ cm$^{-3}$ to approximately $1\times10^{19}$ cm$^{-3}$) is formed. In the SiC epitaxial growth layer 12RE, a portion at a side of the SiC polycrystalline growth layer 18PC with respect to the body region 33 is an $n^-$ type drain region 34 (12RE) where a state of the SiC epitaxial growth layer RE is still kept.

A gate trench 35 is formed in the SiC epitaxial growth layer 12RE. The gate trench 35 passes through the body region 33 from the surface 100 of the SiC epitaxial growth layer 12RE, and a deepest portion of the gate trench 35 extends to the drain region 34 (12RE).

A gate insulating film 36 is formed on an inner surface of the gate trench 35 and the surface 100 of the SiC epitaxial growth layer 12RE so as to cover the whole of the inner surface of the gate trench 35. Moreover, a gate electrode 37 is embedded in the gate trench 35 by filling up the inside of the gate insulating film 36 with, for example, polysilicon. A gate terminal G is connected to the gate electrode 37.

An $n^+$ type source region 38 forming a part of a side surface of the gate trench 35 is formed on a surface portion of the body region 33.

Moreover, a $p^+$ type body contact region 39 (of which an impurity concentration is, for example, approximately $1\times10^{18}$ cm$^{-3}$ to approximately $1\times10^{21}$ cm$^{-3}$) which passes through the source region 38 from the surface 100 and is connected to the body region 33 is formed on the SiC epitaxial growth layer 12.

An interlayer insulating film 40 including SiO$_2$ is formed on the SiC epitaxial growth layer 12RE. A source electrode 42 is connected to the source region 38 and the body contact region 39 through a contact hole 41 formed in the interlayer insulating film 40. A source terminal S is connected to the source electrode 42.

A predetermined voltage (voltage equal to or greater than a gate threshold voltage) is applied to the gate electrode 37 in a state where a predetermined potential difference is generated between the source electrode 42 and the drain electrode 32 (between the source and the drain). Thereby, a channel can be formed by an electric field from the gate electrode 37 near the interface between the gate insulating film 36 and the body region 33. Thus, an electric current can be flowed between the source electrode 42 and the drain electrode 32, and thereby SiC-TMOSFET 31 can be turned ON state.

(SiC Planar-Gate Type MOSFET)

Figure 21:
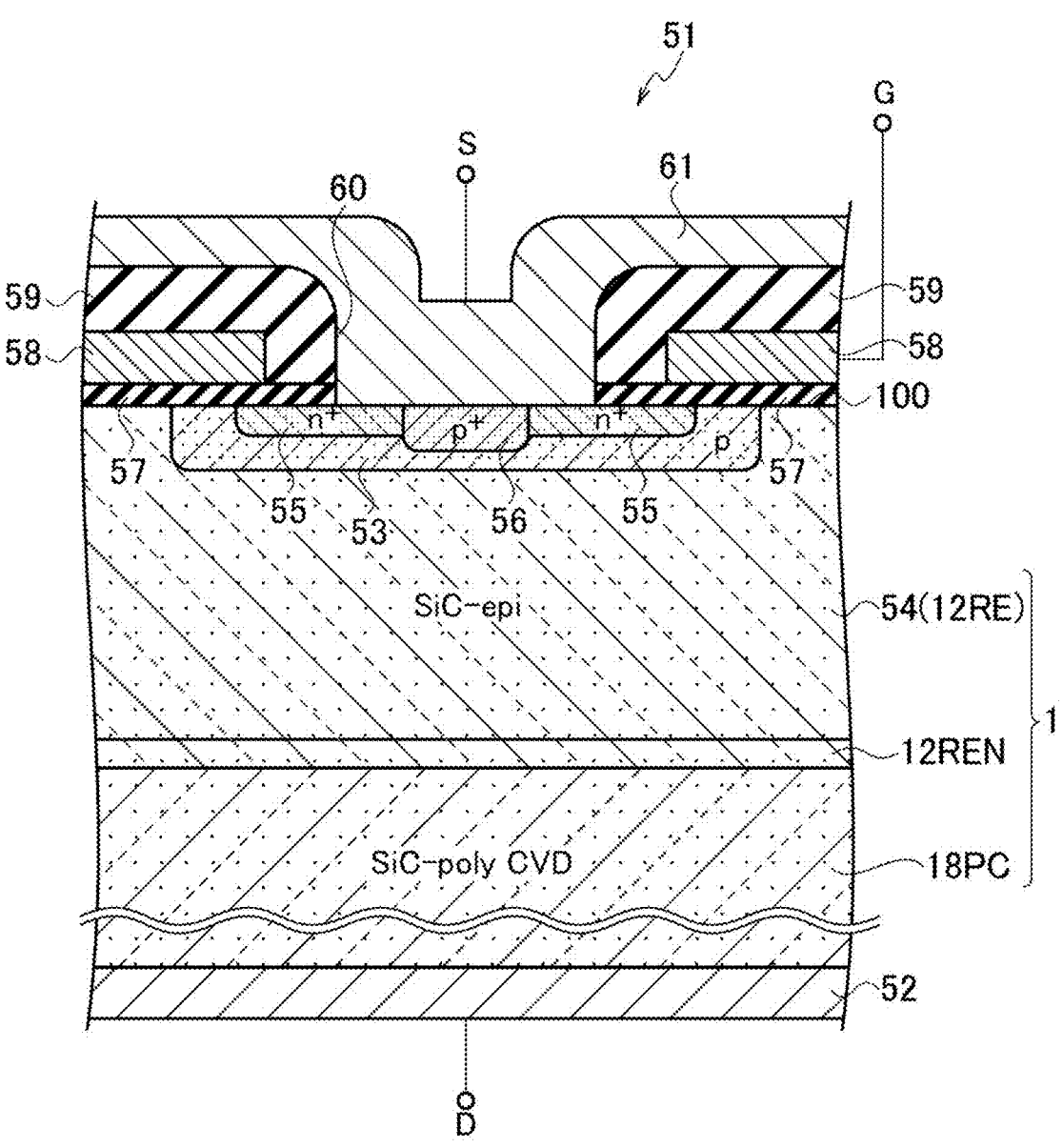
FIG. 21 illustrates a cross-sectional diagram illustrating a planar-gate type MOSFET fabricated using the semiconductor substrate according to the embodiments.

As a semiconductor device fabricated using the semiconductor substrate 1 according to the embodiments, a planar-gate type MOSFET 51 includes a semiconductor substrate 1 including an SiC polycrystalline growth layer 18PC and an SiC epitaxial growth layer 12RE, as illustrated in FIG. 21. In addition, a highly doped layer 12REN may be interposed between the SiC polycrystalline growth layer 18PC and the SiC epitaxial growth layer 12RE. In this case, the highly doped layer 12REN suppresses a depletion layer spreading in the SiC epitaxial growth layer 12RE and also facilitates the ohmic contact with the SiC polycrystalline growth layer 18PC formed on the C plane of the SiC epitaxial growth layer 12RE. The SiC epitaxial growth layer 12RE is a drift layer, the highly doped layer 12REN is a buffer layer, and the SiC polycrystalline growth layer 18PC is a substrate layer.

The SiC polycrystalline growth layer 18PC is doped into an $n^+$ type (of which an impurity density is, for example, approximately $1\times10^{18}$ cm$^{-3}$ to approximately $1\times10^{21}$ cm$^{-3}$), and the SiC epitaxial growth layer 12 is doped into an $n^-$ type (of which an impurity density is, for example, approximately $5\times10^{14}$ cm$^{-3}$ to approximately $5\times10^{16}$ cm$^{-3}$).

Moreover, the SiC epitaxial growth layer 12 may contain one crystal structure selected from a group consisting of 4H—SiC, 6H—SiC, and 2H—SiC crystal structures.

As an n type doping impurity, for example, nitrogen (N), phosphorus (P), arsenic (As), or the like can be applied.

As a p type doping impurity, for example, boron (B), aluminum (Al), TMA, or the like can be applied.

A back side surface ((000-1) C plane) of the SiC single crystal substrate 10SB includes a drain electrode 52 so as to cover the whole region of the back side surface, and the drain electrode 52 is connected to a drain terminal D.

Near the front side surface 100 ((0001) Si plane) (surface portion) of the SiC epitaxial growth layer 12RE, a p type body region 53 (of which an impurity concentration is, for example, approximately $1\times10^{16}$ cm$^{-3}$ to approximately $1\times10^{19}$ cm$^{-3}$) is formed in a well shape. In the SiC epitaxial growth layer 12RE, a portion at a side of the SiC single crystal substrate 10SB with respect to the body region 53 is an $n^-$ type drain region 54 (12RE) where a state after the epitaxial growth is still kept.

An $n^+$ type source region 55 is formed on a surface portion of the body region 53 with a certain space from a periphery of the body region 53.

A $p^+$ type body contact region 56 (of which an impurity concentration is, for example, approximately $1\times10^{18}$ cm$^{-3}$ to approximately $1\times10^{21}$ cm$^{-3}$) is formed inside of the source region 55. The body contact region 56 passes through the source region 55 in a depth direction, and is connected to the body region 53.

A gate insulating film 57 is formed on the front side surface 100 of the SiC epitaxial growth layer 12RE. The gate insulating film 57 covers the portion surrounding the source region 55 in the body region 53 (peripheral portion of the body region 53), and an outer peripheral portion of the source region 55.

A gate electrode 58 including polysilicon, for example, is formed on the gate insulating film 57. The gate electrode 58 is opposed to the peripheral portion of the body region 53 so as to sandwich the gate insulating film 57. A gate terminal G is connected to the gate electrode 58.

An interlayer insulating film 59 including SiO$_2$ is formed on the SiC epitaxial growth layer 12RE. A source electrode 61 is connected to the source region 55 and the body contact region 56 through a contact hole 60 formed in the interlayer insulating film 59. A source terminal S is connected to the source electrode 61.

A predetermined voltage (voltage equal to or greater than a gate threshold voltage) is applied to the gate electrode 58 in a state where a predetermined potential difference is generated between the source electrode 61 and the drain electrode 52 (between the source and the drain). Thereby, a channel can be formed by an electric field from the gate electrode 58 near the interface between the gate insulating film 57 and the body region 53. Thus, an electric current can be flowed between the source electrode 61 and the drain electrode 52, and thereby the planar-gate type MOSFET 51 can be turned ON state.

Although the embodiments have been explained above, the embodiment can also be implemented with other configurations.

For example, although illustration is omitted, an MOS capacitor can also be fabricated using the semiconductor substrate 1 according to the embodiments. According to such MOS capacitors, a yield and reliability can be improved.

Moreover, although illustration is omitted, bipolar junction transistors can also be fabricated using the semiconductor substrate 1 according to the embodiments. In addition, the semiconductor substrate 1 according to the embodiments can also be used for fabrication of SiC pn diodes, SiC IGBTs, SiC complementary MOSFETs, and the like. Moreover, the semiconductor substrate 1 according to the embodiments can also be applied to other type devices such as Light Emitting Diodes (LEDs) and Semiconductor Optical Amplifiers (SOAs), for example.

(Crystal Plane)

Figures 22A, 22B:
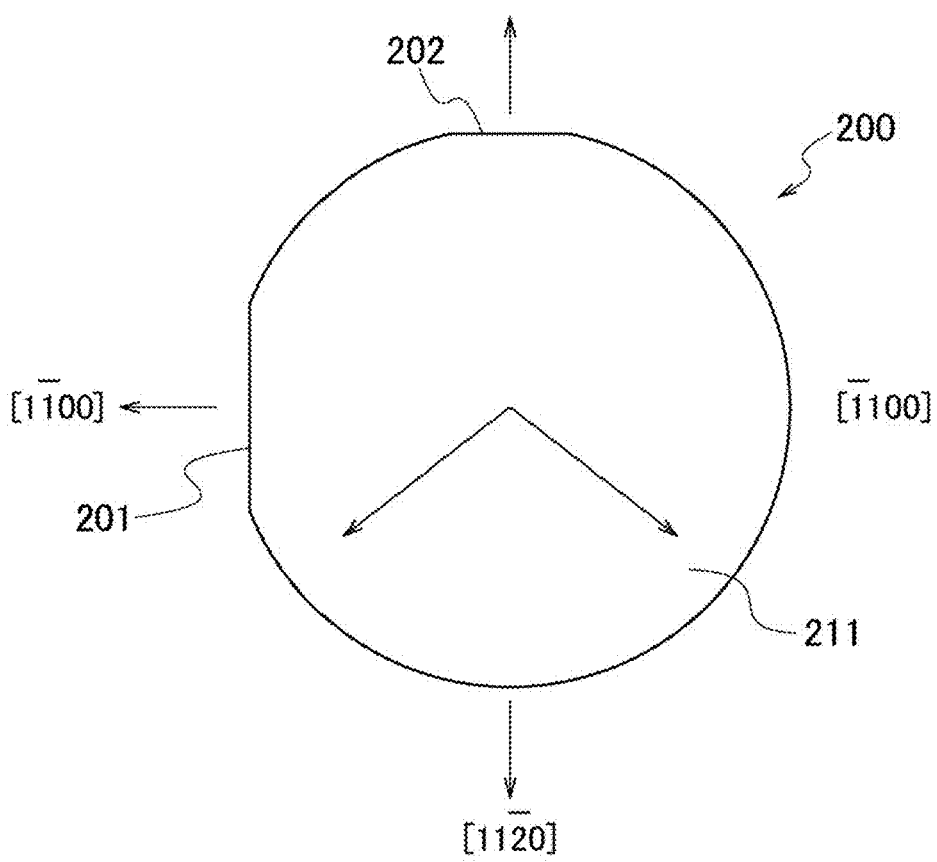
FIG. 22A illustrates a top view diagram for explaining a crystal plane of SiC.
FIG. 22B illustrates a side view diagram for explaining the crystal plane of SiC.

FIG. 22 is a diagram for explaining a crystal plane of SiC. FIG. 22A is a top view diagram illustrating an Si plane 211 of an SiC wafer 200 on which a primary orientation flat 201 and a secondary orientation flat 202 are formed. In the side view diagram observed from the orientation of [−1100] illustrated in FIG. 22B, an Si plane 211 of the orientation of [0001] is formed on an upper surface, and a C plane 212 of an orientation of [000-1] is formed on a lower surface.

Figure 23:
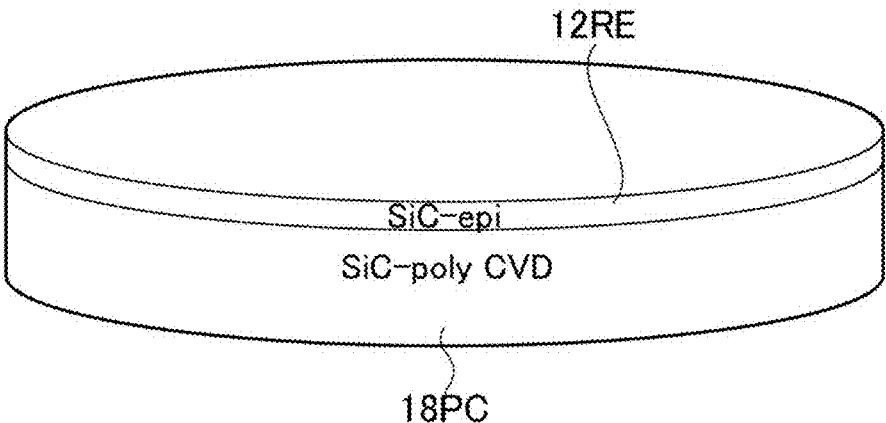
FIG. 23 illustrates a bird's-eye view of a semiconductor substrate (wafer) according to the embodiments.

A schematic bird's-eye view configuration of the semiconductor substrate (wafer) 1 according to the embodiments includes an SiC polycrystalline growth layer 18PC and an SiC epitaxial growth layer 12RE, as illustrated in FIG. 23.

A thickness of the SiC polycrystalline growth layer 18PC is, for example, approximately 150 μm to approximately 500 μm, and a thickness of the SiC epitaxial growth layer 12RE is, for example, approximately 4 μm to approximately 100 μm.

Example of Crystal Structure

FIG. 24A illustrates a schematic bird's-eye view configuration of a unit cell of a 4H—SiC crystal applicable to the SiC epitaxial growth layer 12RE, FIG. 24B illustrates a schematic configuration of a two layer portion of the 4H—SiC crystal, and FIG. 24C illustrates a schematic configuration of four layer portion of the 4H—SiC crystal.

Figure 25:
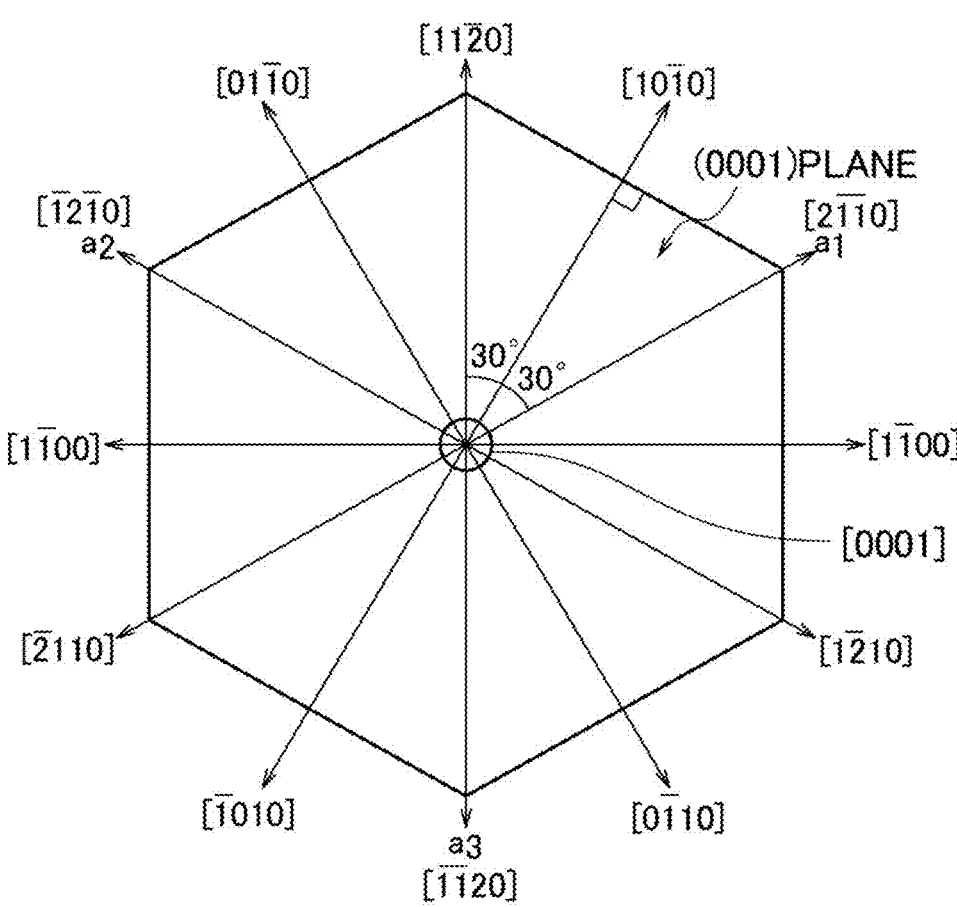
FIG. 25 illustrates a configuration diagram showing the unit cell of the 4H—SiC crystal illustrated in FIG. 24A observed from directly above a (0001) surface.

Moreover, FIG. 25 illustrates a schematic configuration of the unit cell of the 4H—SiC crystal structure of illustrated in FIG. 24A observed from directly above a (0001) surface.

As illustrated in FIGS. 24A to 24C, the crystal structure of the 4H—SiC can be approximated with a hexagonal system, and four C atoms are bound with respect to one Si atom. The four C atoms are positioned at four vertexes of a regular tetrahedron in which the Si atom is disposed at a center thereof. In the four C atoms, one Si atom is positioned in [0001] axial direction with respect to the C atom, and other three C atoms are positioned at a [000-1] axis side with respect to the Si atom. In FIG. 24A, an off angle θ is equal to or less than approximately 4 degrees.

The [0001] axis and [000-1] axis are along the axial direction of the hexagonal prism, and a plane (top plane of the hexagonal prism) using the [0001] axis as a normal line is (0001) plane (Si plane). On the other hand, a surface (bottom surface of the hexagonal prism) using the [000-1] axis as a normal line is (000-1) surface (C surface).

Moreover, directions vertical to the [0001] axis, and passing along the vertexes not adjacent with one another in the hexagonal prism observed from directly above the (0001) plane are respectively a1 axis [2-1-10], a2 axis [-12-10], and a3 axis [-1-120].

As illustrated in FIG. 25, a direction passing through the vertex between the a1 axis and the a2 axis is [11-20] axis, a direction passing through the vertex between the a2 axis and the a3 axis is [-2110] axis, and a direction passing through the vertex between the a3 axis and the a1 axis is [1-210] axis.

The axes which are incline at an angle of 30 degrees with respect to each axis of the both sides, and used as the normal line of each side surface of the hexagonal prism, between each of the axes of the above-mentioned six axes passing through the respective vertexes of the hexagonal prism, are respectively [10-10] axis, [1-100] axis, [0-110] axis, [-1010] axis, [-1100] axis, and [01-10] axis, in the clockwise direction sequentially from between the a1 axis and the [11-20] axes. Each plane (side plane of the hexagonal prism) using these axes as the normal line is a crystal surface right-angled to the (0001) plane and the (000-1) plane.

The epitaxial growth layer 12RE may include at least one type or a plurality of types semiconductor(s) selected from a group consisting of group IV semiconductors, group III-V compound semiconductors, and group II-VI compound semiconductors.

Moreover, the SiC single crystal substrate 10SB and the SiC epitaxial growth layer 12RE may contain any one material selected from a group consisting of 4H—SiC, 6H—SiC, and 2H—SiC materials.

In addition, the SiC single crystal substrate 10SB and the SiC epitaxial growth layer 12RE may contain at least one type selected from a group consisting of GaN, BN, AlN, $Al_2O_3$, $Ga_2O_3$, diamond, carbon, and graphite, as other materials except for SiC.

The semiconductor device including the semiconductor substrate according to the embodiments may include any one of GaN-based, AlN-based, and gallium-oxide-based IGBTs, diodes, MOSFETs, and thyristors, except for SiC-based devices.

The semiconductor device including the semiconductor substrate according to the embodiments may include a configuration of any one of a 1-in-1 module, a 2-in-1 module, a 4-in-1 module, a 6-in-1 module, a 7-in-1 module, an 8-in-1 module, a 12-in-1 module, or a 14-in-1 module.

In accordance with the semiconductor substrate according to the embodiments, it is possible to use, for example, a low cost SiC polycrystalline substrate, instead of a high cost SiC single crystalline substrate, as a substrate material.

Other Embodiments

As explained above, the embodiments have been described, as a disclosure including associated description and drawings to be construed as illustrative, not restrictive. It will be apparent to those skilled in the art from the disclosure that various alternative embodiments, examples and implementations can be made.

Such being the case, the embodiments cover a variety of embodiments and the like, whether described or not.

INDUSTRIAL APPLICABILITY

The semiconductor substrate of the present embodiments and the power semiconductor device including such a semiconductor substrate can be used for semiconductor module techniques, e.g., IGBT modules, diode modules, MOS modules (SiC, GaN, AlN, Gallium oxide), and the like; and can be applied to a wide range of application fields such as power modules for inverter circuits that drive electric motors used as power sources for electric vehicles (including hybrid vehicles), trains, industrial robots and the like or power modules for inverter circuits that convert electric power generated by other power generators (particularly, private power generators) such as solar cells and wind power generators into electric power of a commercial power source.

What is claimed is:

1. A semiconductor substrate comprising:
an SiC single crystal substrate;
a graphene layer disposed on an Si plane of the SiC single crystal substrate;
an SiC epitaxial growth layer disposed above the SiC single crystal substrate via the graphene layer and having an Si plane that is a surface on which a device is formed; and
a polycrystalline layer disposed on an Si plane of the SiC epitaxial growth layer.

2. The semiconductor substrate according to claim 1, wherein the polycrystalline layer comprises a polycrystalline Si layer or a polycrystal SiC layer.

3. The semiconductor substrate according to claim 2, further comprising a graphite substrate or a silicon substrate disposed on the polycrystalline layer.

4. The semiconductor substrate according to claim 3, further comprising an SiC polycrystalline growth layer disposed on a C plane of the SiC epitaxial growth layer.

5. The semiconductor substrate according to claim 4, wherein the SiC epitaxial growth layer comprises a highly doped layer having a higher impurity concentration than a layer of the SiC epitaxial growth layer that is on a plane in contact with the SiC polycrystalline growth layer.

6. The semiconductor substrate according to claim 1, further comprising a graphite substrate or a silicon substrate disposed on the polycrystalline layer.

7. The semiconductor substrate according to claim 6, further comprising an SiC polycrystalline growth layer disposed on a C plane of the SiC epitaxial growth layer.

8. The semiconductor substrate according to claim 7, wherein the SiC epitaxial growth layer comprises a highly doped layer having a higher impurity concentration than a layer of the SiC epitaxial growth layer that is on a plane in contact with the SiC polycrystalline growth layer.

9. The semiconductor substrate according to claim 2, further comprising an SiC polycrystalline growth layer disposed on a C plane of the SiC epitaxial growth layer.

10. The semiconductor substrate according to claim 9, wherein the SiC epitaxial growth layer comprises a highly doped layer having a higher impurity concentration than a layer of the SiC epitaxial growth layer that is on a plane in contact with the SiC polycrystalline growth layer.

11. The semiconductor substrate according to claim 1, wherein the graphene layer comprises a single-layer structure or multi-layer laminated structure of graphene.

12. The semiconductor substrate according to claim 1, further comprising an SiC polycrystalline growth layer disposed on a C plane of the SiC epitaxial growth layer.

13. The semiconductor substrate according to claim 12, wherein the SiC epitaxial growth layer comprises a highly doped layer having a higher impurity concentration than a layer of the SiC epitaxial growth layer that is on a plane in contact with the SiC polycrystalline growth layer.

\* \* \* \* \*